United States Patent
Ko et al.

(10) Patent No.: US 11,289,539 B2
(45) Date of Patent: Mar. 29, 2022

(54) SELF-ALIGNED DIELECTRIC SPACER FOR MAGNETIC TUNNEL JUNCTION PATTERNING AND METHODS FOR FORMING THE SAME

(71) Applicant: Taiwan Semiconductor Manufacturing Company Limited, Hsinchu (TW)

(72) Inventors: Min-Yung Ko, Hsinchu (TW); Shih-Chang Liu, Alian Township (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/885,367

(22) Filed: May 28, 2020

(65) Prior Publication Data
US 2021/0375988 A1 Dec. 2, 2021

(51) Int. Cl.
*G11C 11/16* (2006.01)
*H01L 43/02* (2006.01)
*H01L 27/22* (2006.01)

(52) U.S. Cl.
CPC .......... *H01L 27/228* (2013.01); *G11C 11/161* (2013.01); *H01L 43/02* (2013.01)

(58) Field of Classification Search
CPC ...... H01L 27/228; H01L 43/02; G11C 11/161
See application file for complete search history.

(56) References Cited

U.S. PATENT DOCUMENTS

| | | | | |
|---|---|---|---|---|
| 9,761,793 | B1* | 9/2017 | Kim | ...................... H01L 27/222 |
| 2015/0311253 | A1* | 10/2015 | Choi | ...................... H01L 43/08 257/252 |
| 2016/0028000 | A1* | 1/2016 | Tsai | ...................... H01L 43/08 438/3 |
| 2019/0304523 | A1 | 10/2019 | O'Brien et al. | |
| 2020/0006634 | A1 | 1/2020 | Brockman et al. | |
| 2020/0006635 | A1 | 1/2020 | Rahman et al. | |

OTHER PUBLICATIONS

Taiwan Patent and Trademark Office, Application No. 109138797 Examination Report dated May 31, 2021, 7 pages.

* cited by examiner

*Primary Examiner* — Shih Tsun A Chou
(74) *Attorney, Agent, or Firm* — The Marbury Law Group, PLLC

(57) ABSTRACT

Pillar stacks of a top electrode and a hard mask portion are formed over a layer stack containing a continuous reference magnetization layer, a continuous nonmagnetic tunnel barrier layer, and a continuous free magnetization layer. A continuous dielectric liner may be deposited and anisotropically etched to form inner dielectric spacers. The continuous free magnetization layer, the continuous nonmagnetic tunnel barrier layer, and the continuous reference magnetization layer may be anisotropically etched to form vertical stacks of a respective reference magnetization layer, a respective nonmagnetic tunnel barrier layer, and a respective free magnetization layer, which are magnetic tunnel junctions. The inner dielectric spacers prevent redeposition of a metallic material of the hard mask portions on sidewalls of the magnetic tunnel junctions. The hard mask portions may be removed, and a metallic cell contact structures may be formed on top of each top electrode.

20 Claims, 18 Drawing Sheets

SELF-ALIGNED DIELECTRIC SPACER FOR MAGNETIC TUNNEL JUNCTION PATTERNING AND METHODS FOR FORMING THE SAME

BACKGROUND

Semiconductor memory devices are widely used in modern electronic devices. Some semiconductor memory devices use memory cells that include a respective vertical stack of a bottom electrode, a memory element, and a top electrode. For example, a magnetic tunnel junction memory device may use such a vertical stack in which the memory element includes a magnetic tunnel junction. The magnetic tunnel junction needs to be patterned without metallic contamination in order to avoid internal electrical shorts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
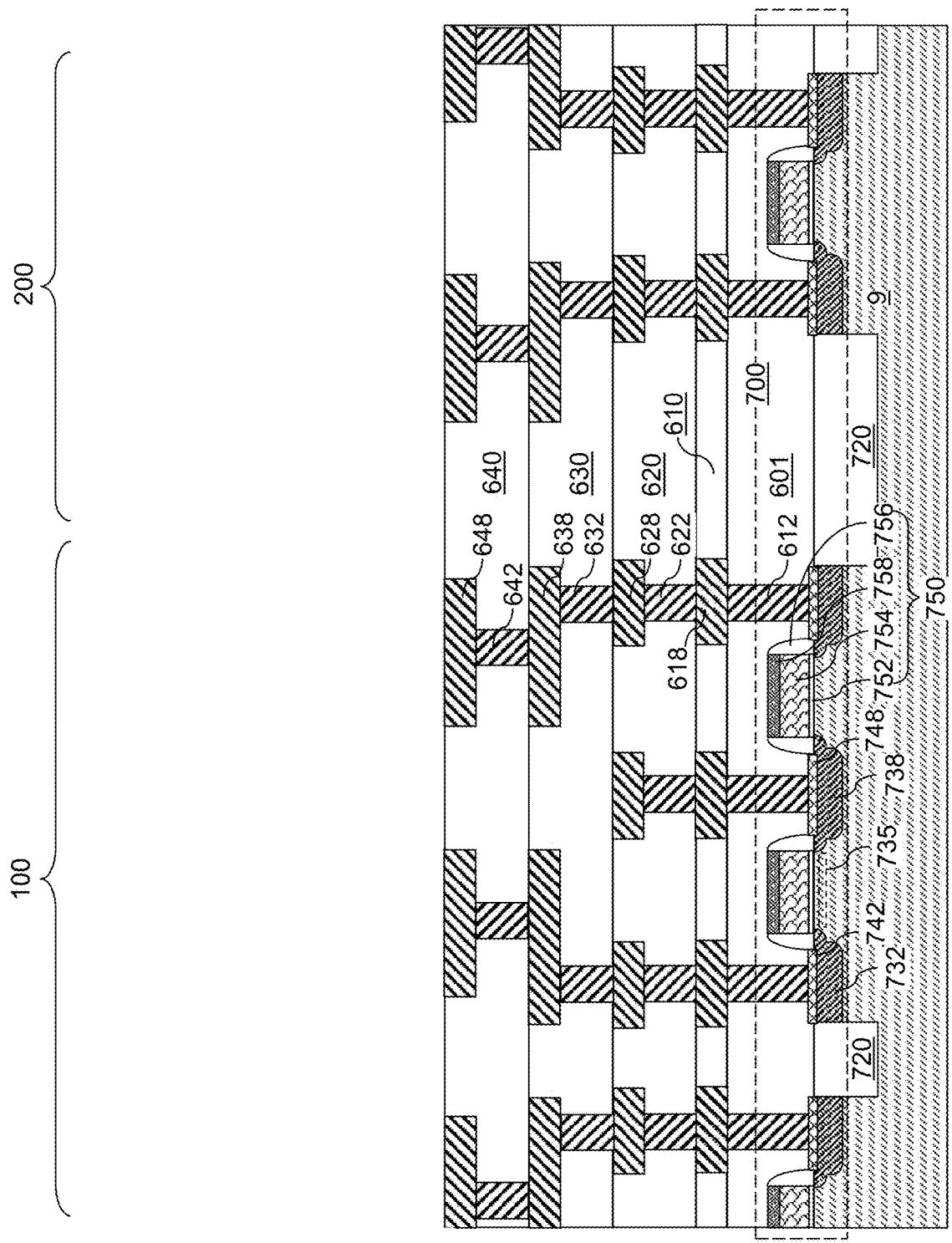
FIG. 1 is a vertical cross-sectional view of an exemplary structure after formation of complementary metal-oxide-semiconductor (CMOS) transistors and metal interconnect structures formed in dielectric material layers according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless expressly indicated otherwise, elements with the same reference numeral are presumed to have the same material composition and the same thickness range.

The present disclosure is directed to semiconductor devices, and specifically to a semiconductor memory device using self-aligned dielectric spacers for patterning magnetic tunnel junctions and methods of forming the same. Generally, the structures and methods of the present disclosure may be used as memory devices including magnetic tunnel junctions that are free of metallic residues on sidewalls thereof. A hard mask portion including a metallic material may be used to pattern a top electrode and an underlying magnetic tunnel junction. The hard mask portion may be used in two separate anisotropic etch processes to pattern the top electrode and underlying magnetic tunnel junction. After patterning the top electrode using a first anisotropic etch process, an inner dielectric spacer having a tapered outer sidewall may be formed around the top electrode. A second anisotropic etch process may use the combination of the hard mask portion and the inner dielectric spacer to pattern the magnetic tunnel junction. Metallic residues that may be generated during the second anisotropic etch process may be spaced from the top electrode by the inner dielectric spacer. Thus, such metallic residues may be prevented from causing electrical shorts (i.e., electrical connections) between the top electrode and the magnetic tunnel junction.

It is to be understood that the memory devices according to embodiments of the present disclosure may comprise a single discrete memory cell, a one-dimensional array of memory cells, or a two-dimensional array of memory cells. It is also to be understood that a one-dimensional array of memory cells of the present disclosure may be implemented as a periodic one-dimensional array of memory cells, and a two-dimensional array of memory cells of the present disclosure may be implemented as a periodic two-dimensional array of memory cells. In addition, while present disclosure is described using an embodiment in which a two-dimensional array of memory cells is formed within fifth metal interconnect levels, which are commonly referred to as a fifth line-and-via (M5+V4) level, embodiments are expressly contemplated herein in which the two-dimensional array of memory cells may be formed within different metal interconnect levels.

Referring to FIG. 1, an exemplary structure according to an embodiment of the present disclosure is illustrated. The exemplary structure may include a semiconductor substrate 9, which may be a commercially available silicon semiconductor substrate. Shallow trench isolation structures 720 including a dielectric material such as silicon oxide may be formed in an upper portion of the semiconductor substrate 9. Suitable doped semiconductor wells, such as p-type wells and n-type wells, may be formed within each area that is laterally enclosed by a continuous portion of the shallow trench isolation structures 720. Field effect transistors may be formed over the top surface of the semiconductor substrate 9. For example, each field effect transistor may include a source region 732, a drain region 738, a semiconductor channel 735 that includes a surface portion of the semiconductor substrate 9 extending between the source region 732 and the drain region 738, and a gate structure 750. Each gate structure 750 may include a gate dielectric 752, a gate electrode 754, a gate cap dielectric 758, and a dielectric gate spacer 756. A source-side metal-semiconductor alloy region 742 may be formed on each source region 732, and a drain-side metal-semiconductor alloy region 748 may be formed on each drain region 738.

The exemplary structure may include a memory array region 100 in which an array of memory elements may be subsequently formed, and a logic region 200 in which logic devices that support operation of the array of memory elements may be formed. In one embodiment, devices (such as field effect transistors) in the memory array region 100 may include bottom electrode access transistors that provide access to bottom electrodes of memory cells to be subsequently formed. Top electrode access transistors that provide access to top electrodes of memory cells to be subsequently formed may be formed in the logic region 200 at this processing step. Devices (such as field effect transistors) in the logic region 200 may provide functions that may be needed to operate the array of memory cells to be subsequently formed. Specifically, devices in the logic region may be configured to control the programming operation, the erase operation, and the sensing (read) operation of the array of memory cells. For example, the devices in the logic region may include a sensing circuitry and/or a top electrode bias circuitry. The devices formed on the top surface of the semiconductor substrate 9 may include complementary metal-oxide-semiconductor (CMOS) transistors and optionally additional semiconductor devices (such as resistors, diodes, capacitors, etc.), and are collectively referred to as CMOS circuitry 700.

Various metal interconnect structures formed in dielectric material layers may be subsequently formed over the semiconductor substrate 9 and the devices (such as field effect transistors). The dielectric material layers may include, for example, a contact-level dielectric material layer 601, a first metal-line-level dielectric material layer 610, a second line-and-via-level dielectric material layer 620, a third line-and-via-level dielectric material layer 630, and a fourth line-and-via-level dielectric material layer 640. The metal interconnect structures may include device contact via structures 612 formed in the contact-level dielectric material layer 601 and contact a respective component of the CMOS circuitry 700, first metal line structures 618 formed in the first metal-line-level dielectric material layer 610, first metal via structures 622 formed in a lower portion of the second line-and-via-level dielectric material layer 620, second metal line structures 628 formed in an upper portion of the second line-and-via-level dielectric material layer 620, second metal via structures 632 formed in a lower portion of the third line-and-via-level dielectric material layer 630, third metal line structures 638 formed in an upper portion of the third line-and-via-level dielectric material layer 630, third metal via structures 642 formed in a lower portion of the fourth line-and-via-level dielectric material layer 640, and fourth metal line structures 648 formed in an upper portion of the fourth line-and-via-level dielectric material layer 640. In one embodiment, the second metal line structures 628 may include source lines that are connected a source-side power supply for an array of memory elements. The voltage provided by the source lines may be applied to the bottom electrodes through the access transistors provided in the memory array region 100.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638, 642, 648) may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable materials within the contemplated scope of disclosure may also be used. In one embodiment, the first metal via structures 622 and the second metal line structures 628 may be formed as integrated line and via structures by a dual damascene process, the second metal via structures 632 and the third metal line structures 638 may be formed as integrated line and via structures by a dual damascene process, and/or the third metal via structures 642 and the fourth metal line structures 648 may be formed as integrated line and via structures by a dual damascene process. While the present disclosure is described using an embodiment in which an array of memory cells formed over the fourth line-and-via-level dielectric material layer 640, embodiments are expressly contemplated herein in which the array of memory cells may be formed at a different metal interconnect level.

Figure 2:
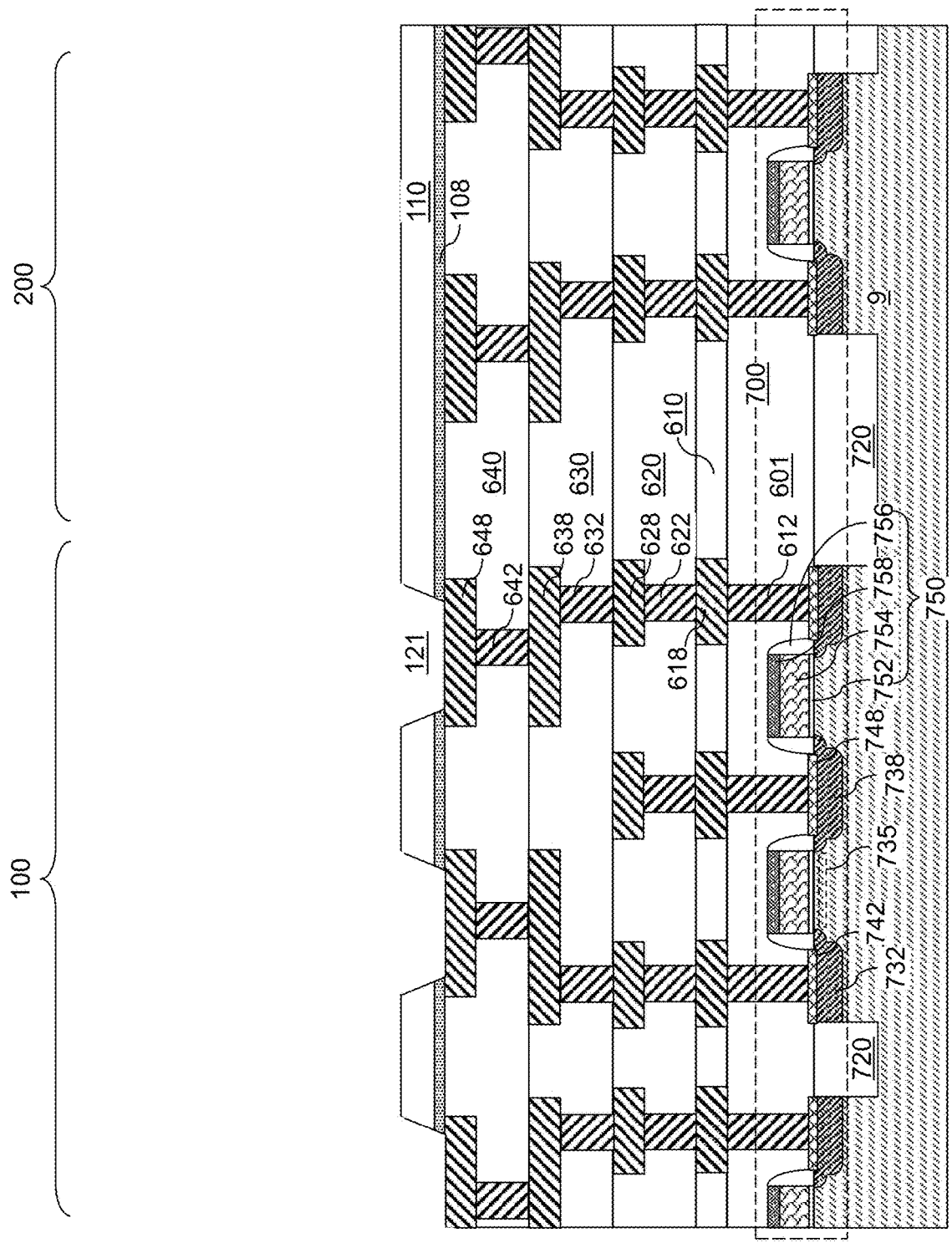
FIG. 2 is a vertical cross-sectional view of the exemplary structure after formation of a dielectric cap layer, a via-level dielectric layer, and lower-electrode-contact via cavities according to an embodiment of the present disclosure.

Referring to FIG. 2, a dielectric cap layer 108 and a via-level dielectric layer 110 may be sequentially formed over the metal interconnect structures and the dielectric material layers. For example, the dielectric cap layer 108 may be formed on the top surfaces of the fourth metal line structures 648 and on the top surface of the fourth line-and-via-level dielectric material layer 640. The dielectric cap layer 108 may include a dielectric capping material that may protect underlying metal interconnect structures such as the fourth metal line structures 648. In one embodiment, the dielectric cap layer 108 may include a material that may provide high etch resistance, i.e., a dielectric material that may also function as an etch stop material during a subsequent anisotropic etch process that etches the via-level dielectric layer 110. For example, the dielectric cap layer 108 may include silicon carbide or silicon nitride, and may have a thickness in a range from 5 nm to 30 nm, although lesser and greater thicknesses may also be used.

The via-level dielectric layer 110 may include any material that may be used for the dielectric material layers (601, 610, 620, 630, 640). For example, the via-level dielectric layer 110 may include undoped silicate glass or a doped silicate glass deposited by decomposition of tetraethylorthosilicate (TEOS). The thickness of the via-level dielectric layer 110 may be in a range from 50 nm to 200 nm, although lesser and greater thicknesses may also be used. The dielectric cap layer 108 and the via-level dielectric layer 110 may be formed as planar blanket (unpatterned) layers having a respective planar top surface and a respective planar bottom surface that extends throughout the memory array region 100 and the logic region 200.

Via cavities may be formed through the via-level dielectric layer 110 and the dielectric cap layer 108. For example, a photoresist layer (not shown) may be applied over the via-level dielectric layer 110 and may be patterned to form opening within areas of the memory array region 100 that overlie a respective one of the fourth metal line structures 648. An anisotropic etch may be performed to transfer the pattern in the photoresist layer through the through the via-level dielectric layer 110 and the dielectric cap layer 108. The via cavities formed by the anisotropic etch process are herein referred to as lower-electrode-contact via cavities 121 because bottom electrode connection via structures are subsequently formed in the lower-electrode-contact via cavities 121. The lower-electrode-contact via cavities 121 may have tapered sidewalls having a taper angle (within respective to a vertical direction) in a range from 1 degree to 10 degrees.

A top surface of a fourth metal line structure 648 may be physically exposed at the bottom of each lower-electrode-contact via cavity 121. The photoresist layer may be subsequently removed, for example, by ashing.

Figure 3:
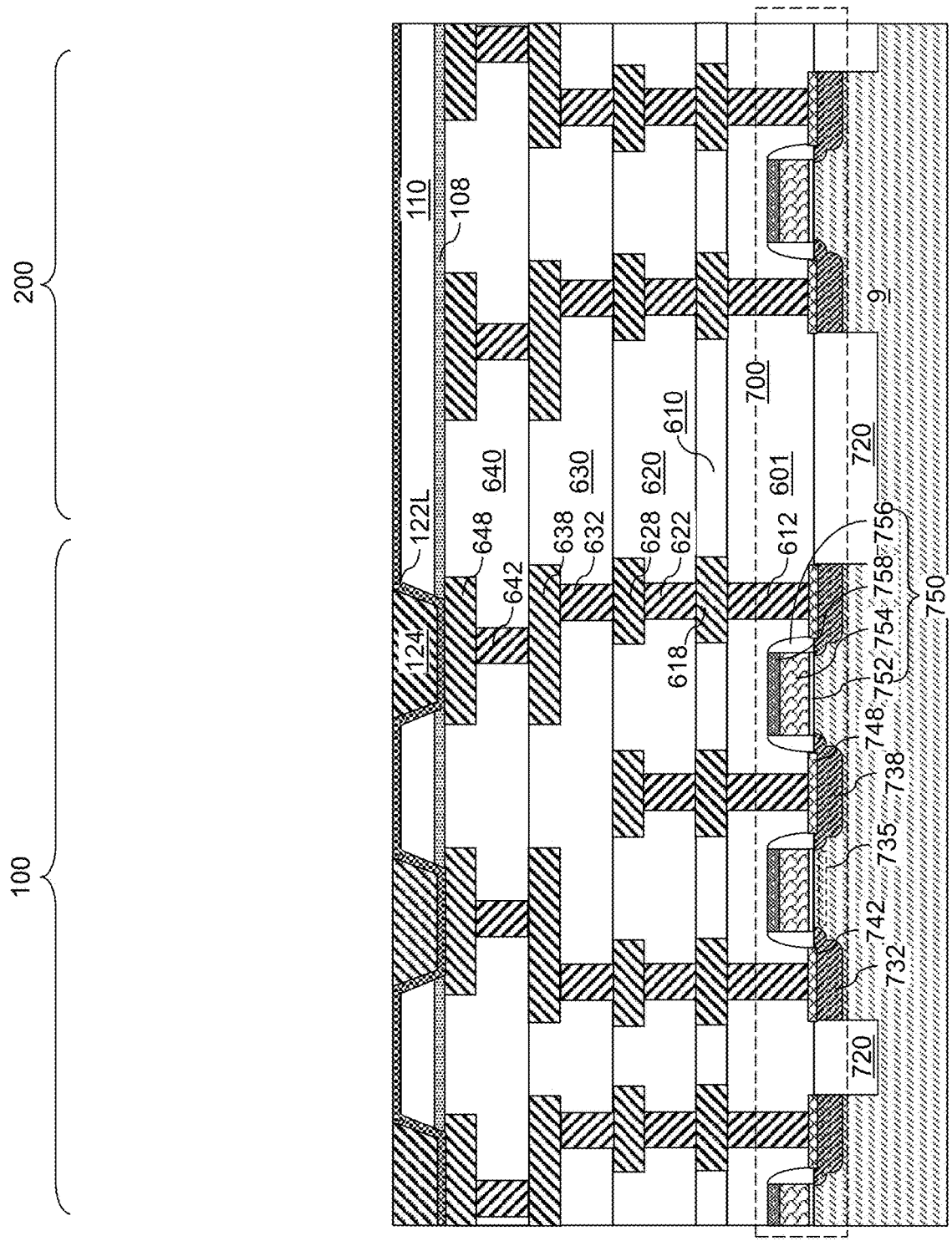
FIG. 3 is a vertical cross-sectional view of the exemplary structure after formation of a continuous metallic barrier layer and metallic via fill material portions according to an embodiment of the present disclosure.

Referring to FIG. 3, a continuous metallic barrier layer 122L may be formed as a continuous material layer. The continuous metallic barrier layer 122L may cover physically exposed top surfaces of the fourth metal line structures 648, tapered sidewalls of the lower-electrode-contact via cavities 121, and the top surface of the via-level dielectric layer 110 without any hole therethrough. The continuous metallic barrier layer 122L may include a conductive metallic nitride such as TiN, TaN, and/or WN. Other suitable materials within the contemplated scope of disclosure may also be used. The thickness of the continuous metallic barrier layer 122L may be in a range from 3 nm to 20 nm, although lesser and greater thicknesses may also be used.

A metallic fill material such as tungsten or copper may be deposited in remaining volumes of the lower-electrode-contact via cavities 121. Portions of the metallic fill material that overlie the horizontal plane including the topmost surface of the continuous metallic barrier layer 122L may be removed by a planarization process such as chemical mechanical planarization to form metallic via fill material portions 124. Each metallic via fill material portion 124 may have a top surface that may be coplanar with the topmost surface of the continuous metallic barrier layer 122L.

Figure 4:
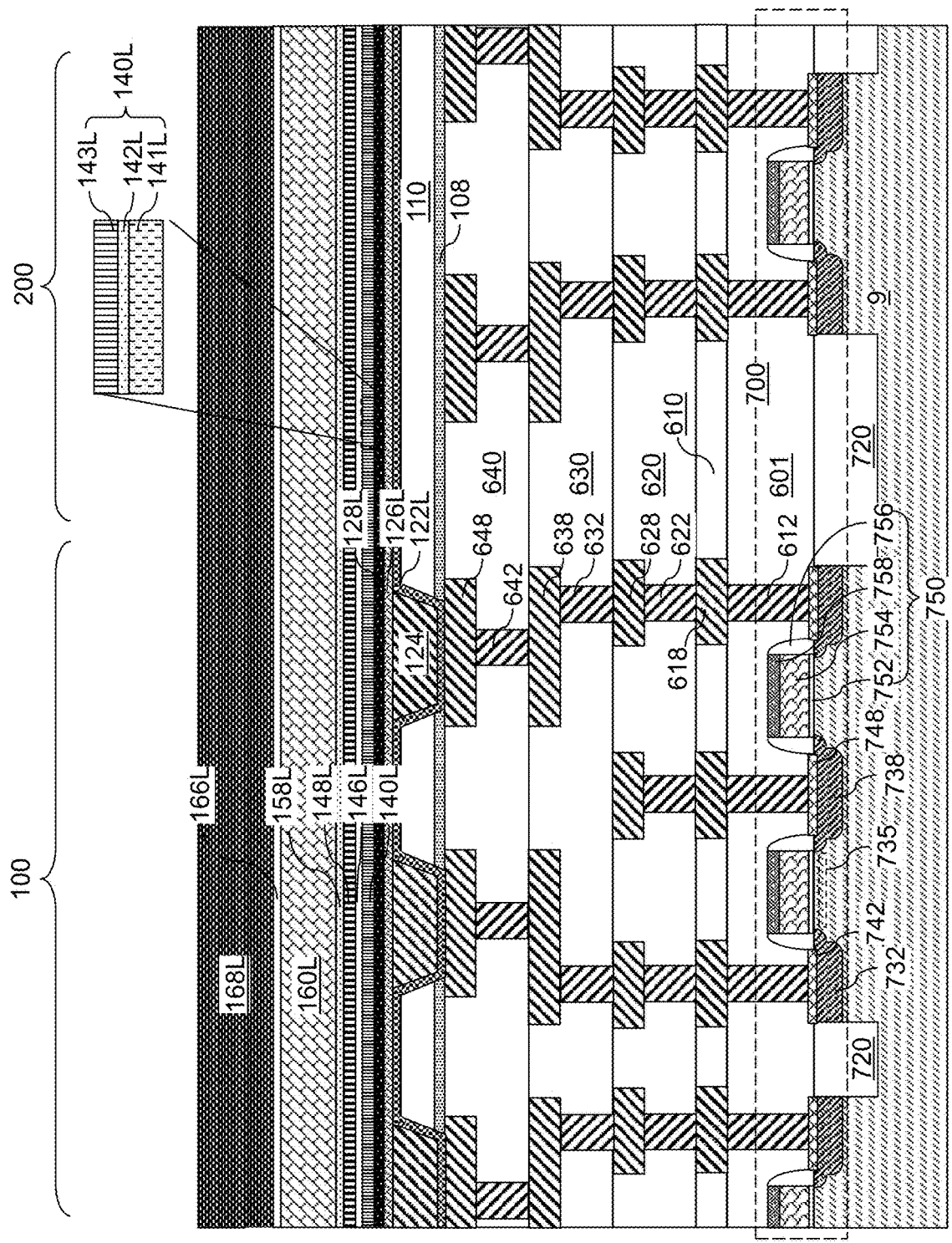
FIG. 4 is a vertical cross-sectional view of the exemplary structure after formation of a continuous bottom electrode material layer, a continuous nonmagnetic metallic buffer layer, a continuous synthetic antiferromagnet layer, a continuous nonmagnetic tunnel barrier layer, a continuous free magnetization layer, at least one continuous capping layer, a continuous top electrode material layer, a continuous dielectric pad layer, and a hard mask material layer according to an embodiment of the present disclosure.

Referring to FIG. 4, a layer stack including a continuous bottom electrode material layer 126L, a continuous nonmagnetic metallic buffer layer 128L, a continuous synthetic antiferromagnet layer 140L, a continuous nonmagnetic tunnel barrier layer 146L, a continuous free magnetization layer 148L, at least one continuous capping layer 158L, and a continuous top electrode material layer 160L may be formed over the continuous metallic barrier layer 122L and the metallic via fill material portions 124. The layers within the layer stack may be deposited by a respective chemical vapor deposition process or a respective physical vapor deposition process. Each layer within the layer stack may be deposited as planar blanket material layers having a respective uniform thickness throughout.

The continuous bottom electrode material layer 126L includes at least one metallic material such as TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the continuous bottom electrode material layer 126L may include, and/or may consist essentially of, tungsten (W). The thickness of the continuous bottom electrode material layer 126L may be in a range from 10 nm to 100 nm, although lesser and greater thicknesses may also be used.

The continuous nonmagnetic metallic buffer layer 128L includes a nonmagnetic material that may function as a seed layer. Specifically, the continuous nonmagnetic metallic buffer layer 128L may provide a template crystalline structure that aligns polycrystalline grains of the materials of the continuous synthetic antiferromagnet layer 140L along directions that maximizes the magnetization of a reference layer within the continuous synthetic antiferromagnet layer 140L. The continuous nonmagnetic metallic buffer layer 128L may include Ti, a CoFeB alloy, a NiFe alloy, ruthenium, or a combination thereof. The thickness of the continuous nonmagnetic metallic buffer layer 128L may be in a range from 3 nm to 30 nm, although lesser and greater thicknesses may also be used.

The continuous synthetic antiferromagnet (SAF) layer 140L may include a layer stack of a continuous ferromagnetic hard layer 141L, a continuous antiferromagnetic coupling layer 142L, and a continuous reference magnetization layer 143L. Each of the continuous ferromagnetic hard layer 141L and the continuous reference magnetization layer 143L may have a respective fixed magnetization direction. The continuous antiferromagnetic coupling layer 142L provides antiferromagnetic coupling between the magnetization of the continuous ferromagnetic hard layer 141L and the magnetization of the continuous reference magnetization layer 143L so that the magnetization direction of the continuous ferromagnetic hard layer 141L and the magnetization direction of the continuous reference magnetization layer 143L remain fixed during operation of the memory cells to be subsequently formed. The continuous ferromagnetic hard layer 141L may include a hard ferromagnetic material such as PtMn, IrMn, RhMn, FeMn, OsMn, etc. The continuous reference magnetization layer 143L may include a hard ferromagnetic material such as Co, CoFe, CoFeB, CoFeTa, NiFe, CoPt, CoFeNi, etc. Other suitable materials within the contemplated scope of disclosure may also be used. The continuous antiferromagnetic coupling layer 142L may include ruthenium or iridium. The thickness of the continuous antiferromagnetic coupling layer 142L may be selected such that the exchange interaction induced by the continuous antiferromagnetic coupling layer 142L stabilizes the relative magnetization directions of the continuous ferromagnetic hard layer 141L and the continuous reference magnetization layer 143L at opposite directions, i.e., in an antiparallel alignment. In one embodiment, the net magnetization of the continuous SAF layer 140L can be minimized by matching the magnitude of the magnetization of the continuous ferromagnetic hard layer 141L with the magnitude of the magnetization of the continuous reference magnetization layer 143L. The thickness of the continuous SAF layer 140L may be in a range from 5 nm to 30 nm, although lesser and greater thicknesses may also be used. Each of the continuous reference magnetization layer 143L, the continuous antiferromagnetic coupling layer 142L, the continuous ferromagnetic hard layer 141L, the continuous bottom electrode material layer 126L, the metallic via fill material portion 124, continuous metallic barrier layer 122L may have a respective uniform thickness throughout.

The continuous nonmagnetic tunnel barrier layer 146L may include a tunneling barrier material, which may be an electrically insulating material having a thickness that allows electron tunneling. For example, the continuous nonmagnetic tunnel barrier layer 146L may include magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). Other suitable materials within the contemplated scope of disclosure may also be used. The thickness of the continuous nonmagnetic tunnel barrier layer 146L may be 0.7 nm to 1.3 nm, although lesser and greater thicknesses may also be used.

The continuous free magnetization layer 148L includes a ferromagnetic material having two stable magnetization directions that are parallel or antiparallel to the magnetization direction of the continuous reference magnetization layer 143L. The continuous free magnetization layer 148L includes a hard ferromagnetic material such as Co, CoFe, CoFeB, CoFeTa, NiFe, CoPt, CoFeNi, etc. Other suitable materials within the contemplated scope of disclosure may also be used. The thickness of the continuous free magnetization layer 148L may be in a range from 1 nm to 6 nm, although lesser and greater thicknesses may also be used.

The at least one continuous capping layer 158L includes at least one capping material. Exemplary capping materials that may be used for the at least one continuous capping layer 158L include, but are not limited to, a metallic material such as Be, Mg, Al, Ti, Ta, W, Ge, Pt, Ru, Cu, an alloy thereof, and a layer stack thereof. Other suitable materials within the contemplated scope of disclosure may also be used. Additionally, or alternatively, the at least one continuous capping layer 158L may include a conductive metal nitride and/or a conductive metal nitride. The total thickness of the at least one continuous capping layer 158L may be in a range from 0.5 nm to 5 nm, although lesser and greater thicknesses may also be used.

The continuous top electrode material layer 160L includes at least one metallic material such as W, Cu, Al, Ti, Ta, Ru, Co, Mo, Pt, an alloy thereof, and/or a combination thereof. Other suitable materials within the contemplated scope of disclosure may also be used. In one embodiment, the continuous top electrode material layer 160L includes an elemental metal. For example, the continuous top electrode material layer 160L may include, and/or may consist essentially of, tungsten (W). The thickness of the continuous top electrode material layer 160L may be in a range from 30 nm to 120 nm, although lesser and greater thicknesses may also be used.

The continuous dielectric pad layer 166L includes a dielectric pad material such as silicon oxide, silicon nitride, or a dielectric metal oxide. For example, the continuous dielectric pad layer 166L may include, and/or may consist essentially of, silicon oxide. The thickness of the continuous dielectric pad layer 166L may be in a range from 5 nm to 20 nm, although lesser and greater thicknesses may also be used.

The hard mask material layer 168L may be deposited over the continuous dielectric pad layer 166L. The hard mask material layer 168L includes a hard mask material, which may be a metallic material or a dielectric material. In one embodiment, the hard mask material layer 168L includes, and/or consists essentially of, at least one metallic nitride material such as TiN, TaN, and/or WN. In one embodiment, the hard mask material layer 168L consists essentially of a single metallic nitride material, which may be selected from TiN, TaN, and WN. The thickness of the hard mask material layer 168L may be in a range from 40 nm to 160 nm, such as from 60 nm to 120 nm, although lesser and greater thicknesses may also be used.

Figure 5:
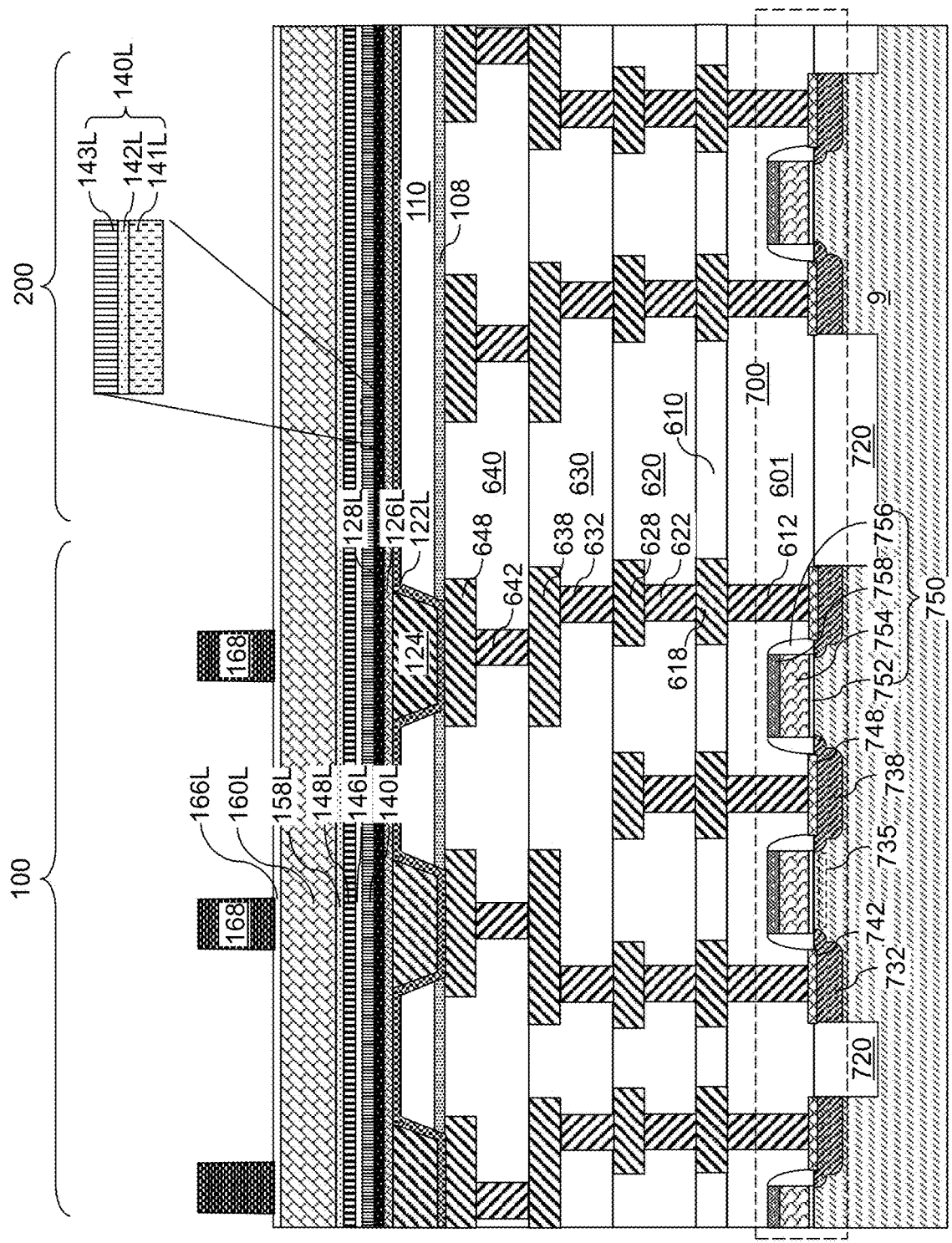
FIG. 5 is a vertical cross-sectional view of the exemplary structure after patterning the hard mask material layer into hard mask portions according to an embodiment of the present disclosure.

Referring to FIG. 5, a photoresist layer (not shown) may be applied over the hard mask material layer 168L, and may be lithographically patterned to form discrete patterned photoresist material portions that are laterally spaced apart from one another. An anisotropic etch process may be performed to etch unmasked portions of the hard mask material layer 168L using the discrete patterned photoresist material portions as an etch mask. The continuous dielectric pad layer 166L may be used as an etch stop layer for the anisotropic etch process. Each patterned portion of the hard mask material layer 168L comprises a hard mask portion 168.

The hard mask portions 168 may be formed over a respective one of the metallic via fill material portions 124. In one embodiment, each of the hard mask portions 168 may have an areal overlap with a respective one of the metallic via fill material portions 124. In one embodiment, the hard mask portions 168 and the metallic via fill material portions 124 may be formed as two-dimensional periodic arrays having a same two-dimensional periodicity. Each hard mask portion 168 may have a horizontal cross-sectional shape of a circle, an ellipse, an oval, a rounded polygon (i.e., a shape derived from a polygon by rounding the corners), a polygon, or a two-dimensional shape having a closed periphery. The maximum lateral dimension of each hard mask portion 168 (such as a diameter of a bottom surface) may be in a range from 20 nm to 120 nm, such as from 30 nm to 90 nm, although lesser and greater maximum lateral dimensions may also be used. The sidewalls of the hard mask portions 168 may be tapered relative to a vertical direction by a taper angle in a range from 1 degree to 5 degrees, such as from 2 degrees to 4 degrees. The photoresist layer may be subsequently removed, for example, by ashing.

Figure 6:
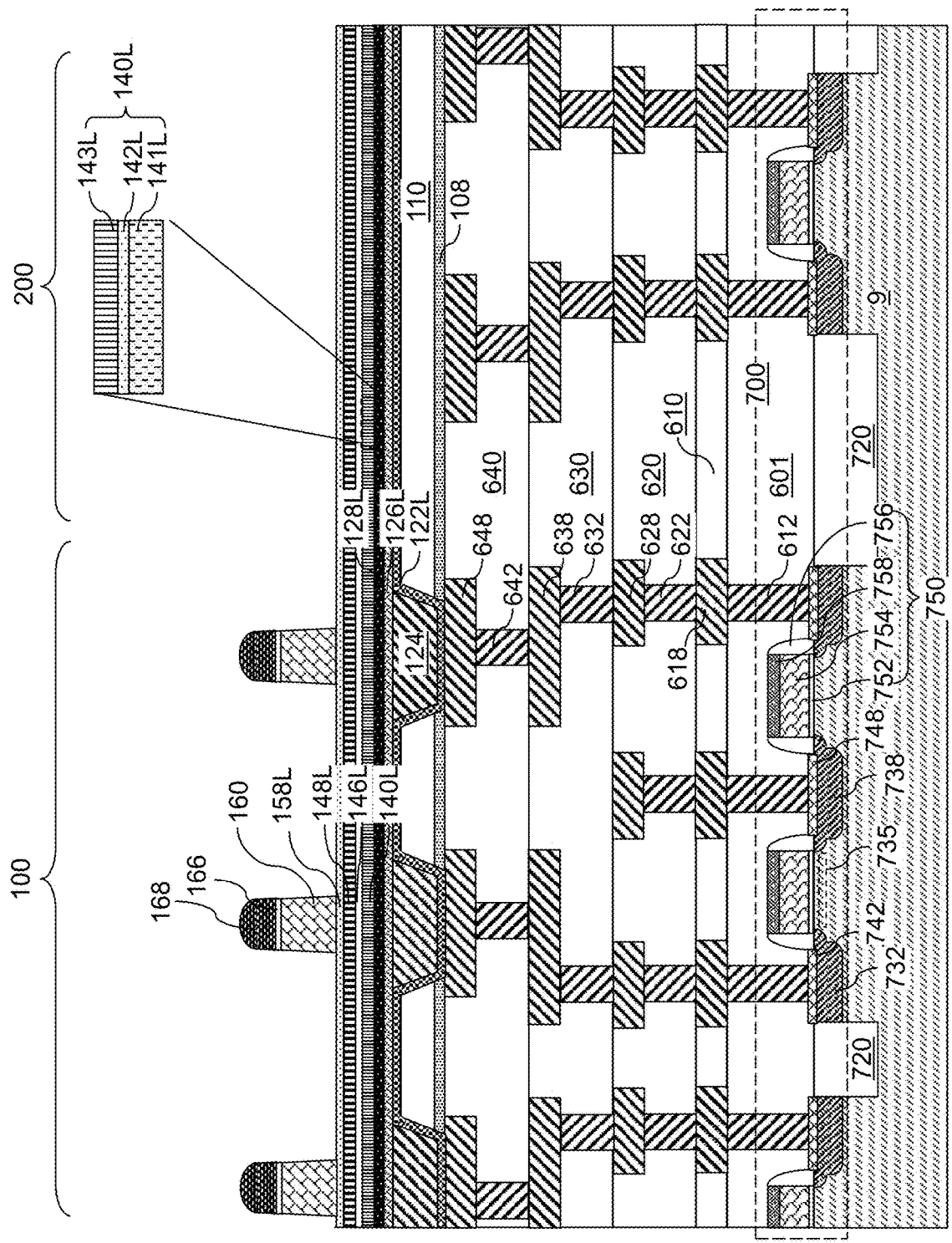
FIG. 6 is a vertical cross-sectional view of the exemplary structure after pillar stacks including a top electrode, a dielectric pad, and a hard mask portion according to an embodiment of the present disclosure.

Referring to FIG. 6, an anisotropic etch process may be performed to transfer the pattern in the hard mask portions 168 through the continuous dielectric pad layer 166L and the continuous top electrode material layer 160L. Unmasked portions of the continuous dielectric pad layer 166L and the top electrode material layer 160L are etched by the anisotropic etch process. The at least one continuous capping layer 158L may be used as an etch stop layer. Each patterned portion of the continuous dielectric pad layer 166L comprises a dielectric pad 166. Each patterned portion of the continuous top electrode material layer 160L comprises a top electrode 160. Each top electrode 160 may have a horizontal cross-sectional shape that is substantially the same as, or laterally expanded from, the shape of the bottom surface of an overlying hard mask portion 168. The maximum lateral dimension of top electrode 160 (such as a diameter of a bottom surface) may be in a range from 20 nm to 125 nm, such as from 30 nm to 95 nm, although lesser and greater maximum lateral dimensions may also be used. The sidewalls of the top electrodes 160 may be tapered relative to a vertical direction by a taper angle in a range from 1 degree to 5 degrees, such as from 2 degrees to 4 degrees.

Pillar stacks (160, 166, 168) comprising a top electrode 160, a dielectric pad 166, and a hard mask portion 168 may be formed above the at least one continuous capping layer 158L. The pillar stacks (160, 166, 168) may be formed as a two-dimensional array, which may be a two-dimensional periodic array. The pillar stacks (160, 166, 168) may be laterally spaced from one another, and may be formed over a layer stack containing the continuous reference magnetization layer 143L, the continuous nonmagnetic tunnel barrier layer 146L, and the continuous free magnetization layer 148L. In one embodiment, the anisotropic etch process may re-deposit a metallic material that is etched off the hard mask portions 168 onto sidewalls of the top electrodes 160. Such re-deposited metallic material on the sidewalls of the top electrodes 160 do not cause any deleterious effects because the at least one continuous capping layer 158L overlies the continuous nonmagnetic tunnel barrier layer 146L.

Figure 7:
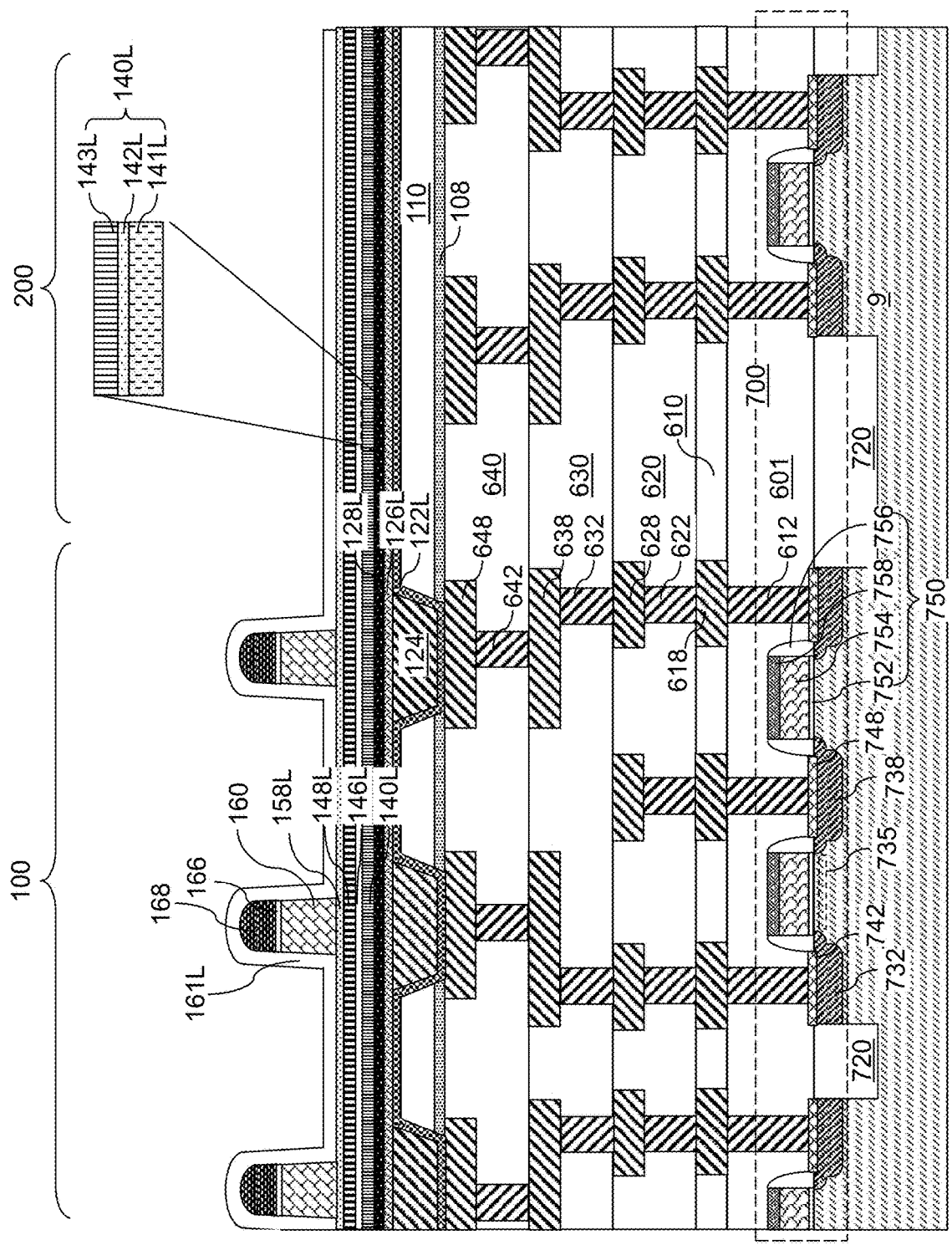
FIG. 7 is a vertical cross-sectional view of the exemplary structure after conformal deposition of a continuous dielectric liner according to an embodiment of the present disclosure.

Referring to FIG. 7, a continuous dielectric liner 161L may be formed over the pillar stacks (160, 166, 168) and the at least one continuous capping layer 158L. The continuous dielectric liner 161L includes a dielectric material such as silicon oxide, silicon nitride, silicon carbide nitride (SiCN), or a dielectric metal oxide (such as aluminum oxide of hafnium oxide). The continuous dielectric liner 161L may be deposited by a conformal deposition process such as atomic layer deposition (ALD) or chemical vapor deposition (such as low pressure chemical vapor deposition or plasma-enhanced chemical vapor deposition with highly conformal coverage). The thickness of the continuous dielectric layer 161L, as measured on sidewalls of the pillar stacks (160, 166, 168), may be in a range from 2 nm to 20 nm, such as from 3 nm to 10 nm, although lesser and greater thicknesses may also be used.

Figure 8:
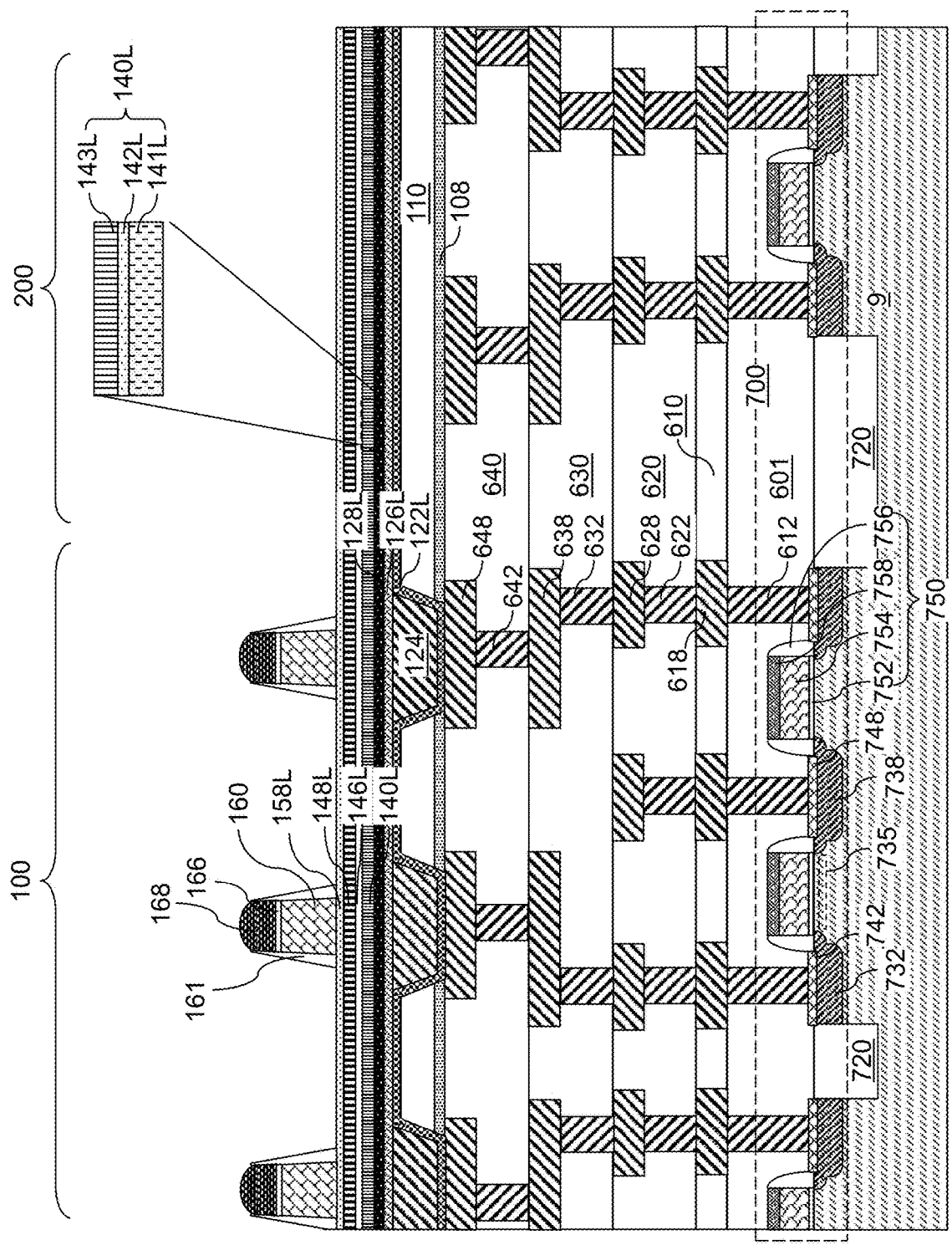
FIG. 8 is a vertical cross-sectional view of the exemplary structure after formation of inner dielectric spacers according to an embodiment of the present disclosure.

Referring to FIG. 8, an anisotropic etch process may be performed to etch horizontal portions of the continuous dielectric liner 161L. The anisotropic etch process may, or may not, be selective to the material of the at least one continuous capping layer 158L. Each remaining vertically-extending portion of the continuous dielectric liner 161L constitutes a dielectric spacer, which is herein referred to as an inner dielectric spacer 161. Each inner dielectric spacer 161 laterally surrounds, and contacts, a respective top electrode 160, and overlies the layer stack containing the continuous reference magnetization layer 143L, the continuous nonmagnetic tunnel barrier layer 146L, and the continuous free magnetization layer 148L. In one embodiment, each inner dielectric spacer 161 may have a variable width that strictly decreases with a vertical distance from a horizontal plane including bottom surfaces of the top electrodes 160. In one embodiment, outer sidewalls of the inner dielectric spacers 161 may have a greater taper angle with respect to the vertical direction than the taper angle of the inner sidewalls of the inner dielectric spacers 161. For example, the outer sidewalls of the inner dielectric spacers 161 may have a taper angle in a range from 2 degrees to 10 degrees, such as from 3 degrees to 6 degrees, and the inner sidewalls of the inner dielectric spacers 161 may have a taper angle in a range from 1 degree to 5 degrees, such as from 2 degrees to 4 degrees. In one embodiment, the distance between an inner periphery of the bottom surface and an outer periphery of the bottom surface of each inner dielectric spacer 161 may be uniform. The thickness of the bottommost portion of each inner dielectric spacers 161 may be in a range from 2 nm to 20 nm, such as from 3 nm to 10 nm, although lesser and greater thicknesses may also be used.

Figure 9:
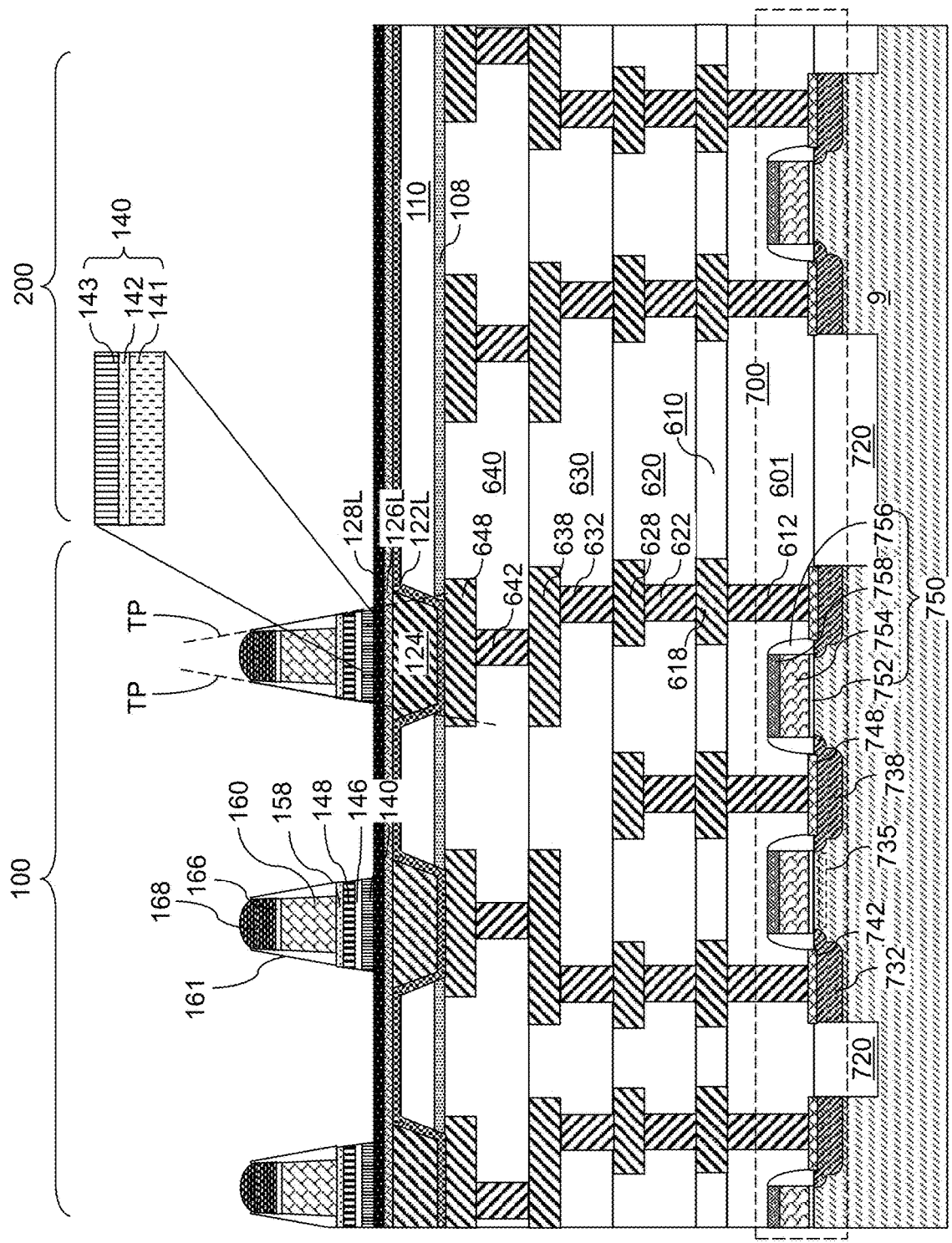
FIG. 9 is a vertical cross-sectional view of the exemplary structure after formation of an array of discrete vertical stacks including a synthetic antiferromagnet structure, a nonmagnetic tunnel barrier layer, a free magnetization layer, and at least one capping layer according to an embodiment of the present disclosure.

Referring to FIG. 9, another anisotropic etch process may be performed to etch unmasked portions of the at least one continuous capping layer 158L, the continuous free magnetization layer 148L, the continuous nonmagnetic tunnel barrier layer 146L, and the continuous synthetic antiferromagnet layer 140L. As discussed above, the continuous synthetic antiferromagnet layer 140L may include a layer stack of a continuous ferromagnetic hard layer 141L, a continuous antiferromagnetic coupling layer 142L, and a continuous reference magnetization layer 143L. The hard mask portions 168 and the inner dielectric spacers 161 may be collectively used as an etch mask layer for the anisotropic etch process. The continuous nonmagnetic metallic buffer layer 128L may be used as an etch stop layer.

An array of discrete vertical stacks of a synthetic antiferromagnet structure 140, a nonmagnetic tunnel barrier 146, a free magnetization structure 148, and at least one capping structure 158 may be formed over the continuous nonmagnetic metallic buffer layer 128L. Each synthetic antiferromagnet structure 140 may be a patterned portion of the continuous synthetic antiferromagnet layer 140L. Each nonmagnetic tunnel barrier 146 may be a patterned portion of the continuous nonmagnetic tunnel barrier layer 146L. Each free magnetization structure 148 may be a patterned portion of the continuous free magnetization layer 148L. Each at least one capping structure 158 may be a patterned portion of the at least one continuous capping layer 158L. Each synthetic antiferromagnet structure 140 may include a layer stack of a ferromagnetic hard lay mask 141, an antiferromagnetic coupling structure 142, and a reference magnetization structure 143. Vertical stacks comprising a respective ferromagnetic hard mask 141, a respective antiferromagnetic coupling structure 142, a respective reference magnetization structure 143, a respective nonmagnetic tunnel barrier 146, a respective free magnetization structure 148, and respective at least one capping structure 158 may be formed. Each vertical stack (141, 142, 143, 146, 148, 158) may comprise a respective magnetic tunnel junction.

Each of the vertical stacks (141, 142, 143, 146, 148, 158) may have a top periphery that coincides with an outer bottom periphery of a respective one of the inner dielectric spacers 161. The at least one capping structure 158 within a vertical stack (141, 142, 143, 146, 148, 158) may comprise a nonmagnetic conductive material, and may contact a bottom surface of an overlying top electrode 160. A top electrode 160 overlies a center portion of the free magnetization structure 148 in the underlying vertical stack (141, 142, 143, 146, 148, 158). Each inner dielectric spacer 161 overlies a peripheral portion of the free magnetization structure 148 in the underlying vertical stack (141, 142, 143, 146, 148, 158), and laterally surrounds a respective top electrode 160. Each inner dielectric spacer 161 may include a tapered outer sidewall having a taper angle in a range from 2 degrees to 10 degrees with respective to a vertical direction.

In one embodiment, the bottom periphery of the tapered outer sidewall of each inner dielectric spacer 161 may be vertically coincident with an outer sidewall of a respective underlying vertical stack (141, 142, 143, 146, 148, 158). In other words, the bottom periphery of the tapered outer sidewall of each inner dielectric spacer 161 and the outer sidewall of a respective underlying vertical stack (141, 142, 143, 146, 148, 158) may be located within a same plane having a taper angle less than 10 degrees. In one embodiment, the bottom periphery of the tapered outer sidewall of each inner dielectric spacer 161 may be vertically coincident with a top periphery of the at least one capping structure 158 within a respective underlying vertical stack (141, 142, 143, 146, 148, 158).

In one embodiment, the reference magnetization structure 143, the nonmagnetic tunnel barrier 146, and the free magnetization structure 148 may include sidewalls located entirely within a common tapered plane TP having a straight profile in vertical cross-sectional views and having closed two-dimensional shapes in horizontal cross-sectional views. The common tapered plane TP may be a circular conical plane, an elliptical conical plane, or generally a continuous plane having a curvature and a taper angle so that surfaces of sidewalls of each layer within a vertical stack (141, 142, 143, 146, 148, 158) are contained entirely within the common tapered plane TP. The horizontal cross-sectional shapes of the common tapered plane TP coincide with the horizontal cross-sectional shapes of the various layers within the vertical stack (141, 142, 143, 146, 148, 158).

Figure 10:
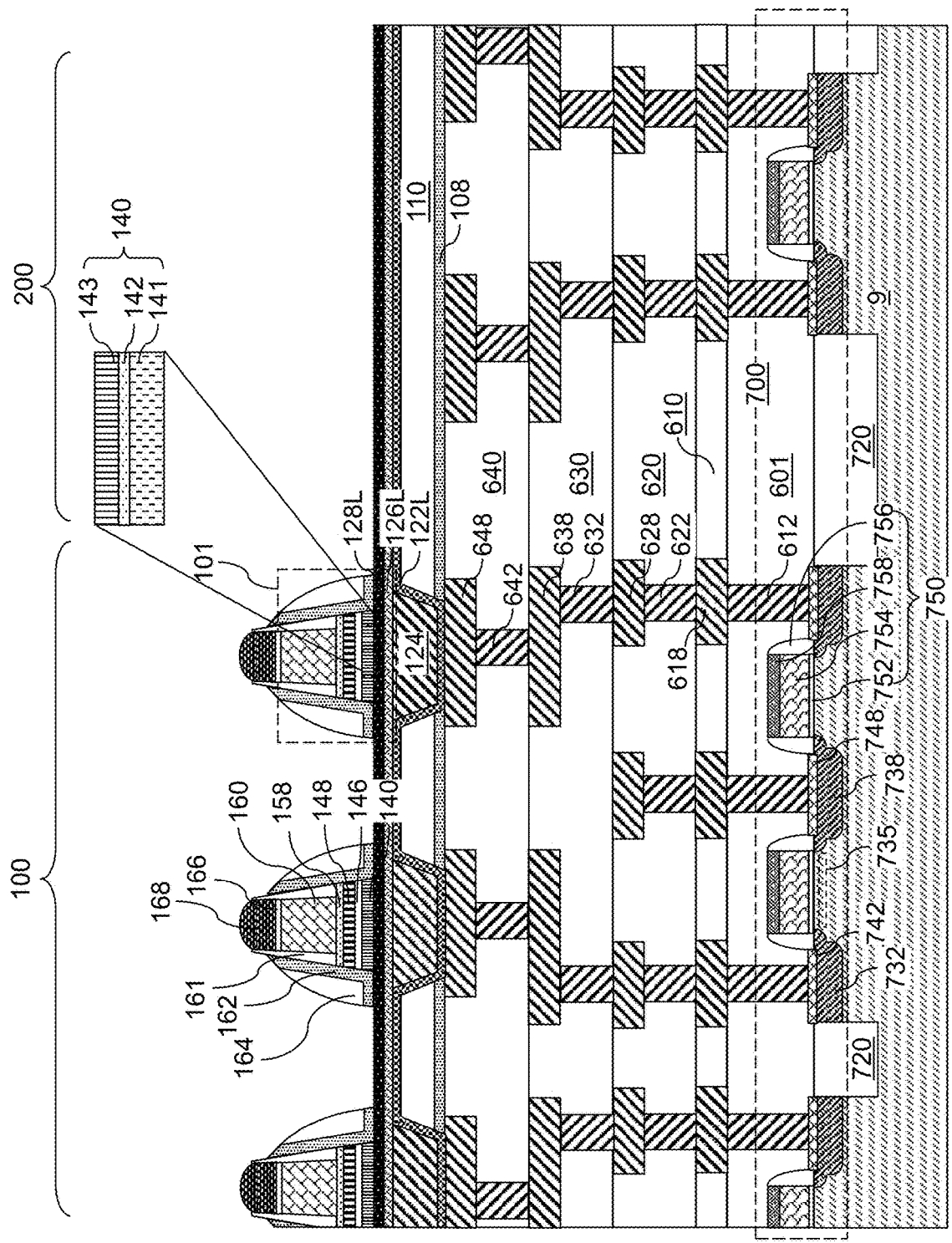
FIG. 10 is a vertical cross-sectional view of the exemplary structure after formation of an array of outer dielectric spacers around the vertical stacks according to an embodiment of the present disclosure.

Referring to FIG. 10, at least one dielectric spacer material layer may be conformally deposited over the array of discrete vertical stacks (141, 142, 143, 146, 148, 158), the top electrodes 160, the hard mask portions 168 and on the physically exposed portions of the top surface of the continuous nonmagnetic metallic buffer layer 128L. For example, a first dielectric spacer material layer including a first dielectric spacer material and a second dielectric spacer material layer including a second dielectric spacer material may be sequentially deposited using a respective conformal deposition process (such as a chemical vapor deposition process). For example, the first dielectric spacer material may include silicon nitride or a dielectric metal oxide (such as aluminum oxide), and the second dielectric spacer material may include silicon oxide (such as TEOS oxide). The thickness of the first dielectric spacer material layer may be in a range from 3 nm to 20 nm, and the thickness of the second dielectric spacer material layer may be in a range from 20 nm to 100 nm, although lesser and greater thicknesses may be used for each of the first dielectric spacer material layer and the second dielectric spacer material layer.

An anisotropic etch process may be performed to remove horizontal portions of the at least one dielectric spacer material layer. The anisotropic etch process that etches the first dielectric spacer material and the second dielectric spacer material may be selective to the materials of the continuous nonmagnetic metallic buffer layer 128L. Each remaining portion of the first dielectric spacer material layer constitutes a first dielectric spacer 162, and each remaining portion of the second dielectric spacer material layer constitutes a second dielectric spacer 164. Each set of a first dielectric spacer 162 and a second dielectric spacer 164 constitutes an outer dielectric spacer (162, 164). Generally, an array of outer dielectric spacers (162, 164) may be formed around, and on, the array of discrete vertical stacks (141, 142, 143, 146, 148, 158) and the array of inner dielectric spacers 161. In one embodiment, each discrete vertical stack (141, 142, 143, 146, 148, 158) may be laterally surrounded by a first dielectric spacer 162 and a second dielectric spacer 164. In another embodiment, the first dielectric spacers 162 may be omitted. In such embodiments, each discrete vertical stack (141, 142, 143, 146, 148, 158) may be laterally surrounded by a single dielectric spacer, i.e., a second dielectric spacer 164 that constitute an entirety of an outer dielectric spacer. In one embodiment, the distance between an inner periphery of the bottom surface and an outer periphery of the bottom surface of each outer dielectric spacer (162, 164) may be uniform throughout.

Figure 11:
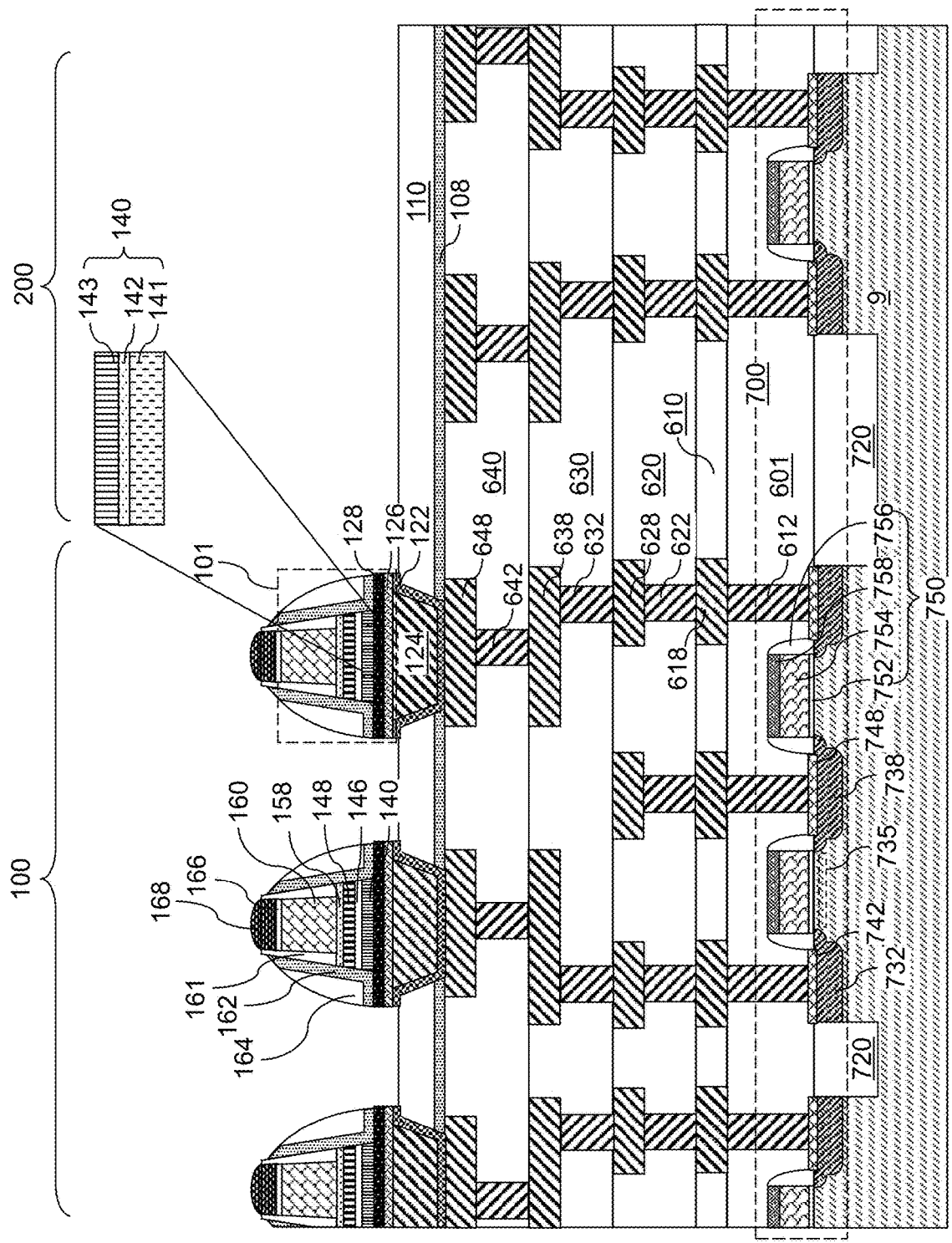
FIG. 11 is a vertical cross-sectional view of the exemplary structure after formation of nonmagnetic metallic buffer layers, bottom electrodes, and bottom electrode connection via structures according to an embodiment of the present disclosure.

Referring to FIG. 11, an etch process may be performed to pattern the continuous nonmagnetic metallic buffer layer 128L, the continuous bottom electrode material layer 126L, and the continuous metallic barrier layer 122L by performing an anisotropic etch process. The continuous nonmagnetic metallic buffer layer 128L, the continuous bottom electrode material layer 126L, and the continuous metallic barrier layer 122L may be anisotropically etched using the outer dielectric spacers (162, 164) and the hard mask portions 168 as an etch mask. Portions of the continuous metallic barrier layer 122L, the continuous bottom electrode material layer 126L, and the continuous nonmagnetic metallic buffer layer 128L that are not masked the array of outer dielectric spacers (162, 164) and the top electrodes 160 may be removed by the etch process. The etch process may be selective to material of the via-level dielectric layer 110. The etch process may include an anisotropic etch process (such as a reactive ion etch process) and/or an isotropic etch process (such as a wet etch process). If the top electrodes 160 include a different material than the materials of the continuous metallic barrier layer 122L, the continuous bottom electrode material layer 126L, and the continuous nonmagnetic metallic buffer layer 128L, the etch process may be selective to the material of the top electrodes 160 (i.e., does not etch the material of the top electrodes 160 significantly).

Each patterned portion of the continuous nonmagnetic metallic buffer layer 128L constitutes a nonmagnetic metallic buffer 128. Each patterned portion of the continuous bottom electrode material layer 126L constitutes a bottom electrode 126. Each patterned portion of the continuous metallic barrier layer 122L constitutes a metallic barrier 122. Each vertical stack of a nonmagnetic metallic buffer 128, a bottom electrode 126, and a metallic barrier 122 may have vertically coincident sidewalls that may be located within a same vertical plane. Each continuous combination of a top electrode 160, a discrete vertical stack (141, 142, 143, 146, 148, 158), a nonmagnetic metallic buffer 128 (which is an optional component), and a bottom electrode 126 constitutes a memory cell 101, which is a magnetoresistive memory cell. Each combination of a metallic barrier 122 and a metallic via fill material portion 124 constitutes a bottom electrode connection via structure (122, 124) that provides electrical connection between a respective bottom electrode 126 and a respective fourth metal line structure 648.

Generally, an array of bottom electrode connection via structures (122, 124) may be formed on a respective underlying one of the metal interconnect structures. An array of memory cells 101 may be formed on the array of bottom electrode connection via structures (122, 124). The array of memory cells 101 may be formed over the semiconductor substrate 9 in the memory array region 100. Each of the memory cells 101 may include a vertical stack that comprises a bottom electrode 126, a memory element (such as a magnetic tunnel junction (143, 146, 148), and a top electrode 160. Each magnetic tunnel junction (143, 146, 148) may comprise a vertical stack of a reference magnetization structure 143, a nonmagnetic tunnel barrier 146, and a free magnetization structure 148.

In an alternative embodiment, the patterning of the continuous nonmagnetic metallic buffer layer 128L, the continuous bottom electrode material layer 126L, and the continuous metallic barrier layer 122L may be performed after forming the array of discrete vertical stacks (141, 142, 143, 146, 148, 158) and prior to formation of the array of outer dielectric spacers (162, 164). In this case, the outer dielectric spacers (162, 164) may be formed on the sidewalls of the nonmagnetic metallic buffer 128, the bottom electrodes 126, and the metallic barrier 122.

In one embodiment, a nonmagnetic metallic buffer 128 may be located between an underlying bottom electrode 126 and an overlying vertical stack (141, 142, 143, 146, 148, 158). An outer bottom periphery of an outer dielectric spacer (162, 164) may coincide with a periphery of a top surface of the nonmagnetic metallic buffer 128. Each of the reference magnetization structures 143 may be electrically connected to a node of a respective one of the field effect transistors located on the semiconductor substrate 9 through a subset of the metal interconnect structures (612, 618, 622, 628, 632, 638, 642, 648).

Figure 12:
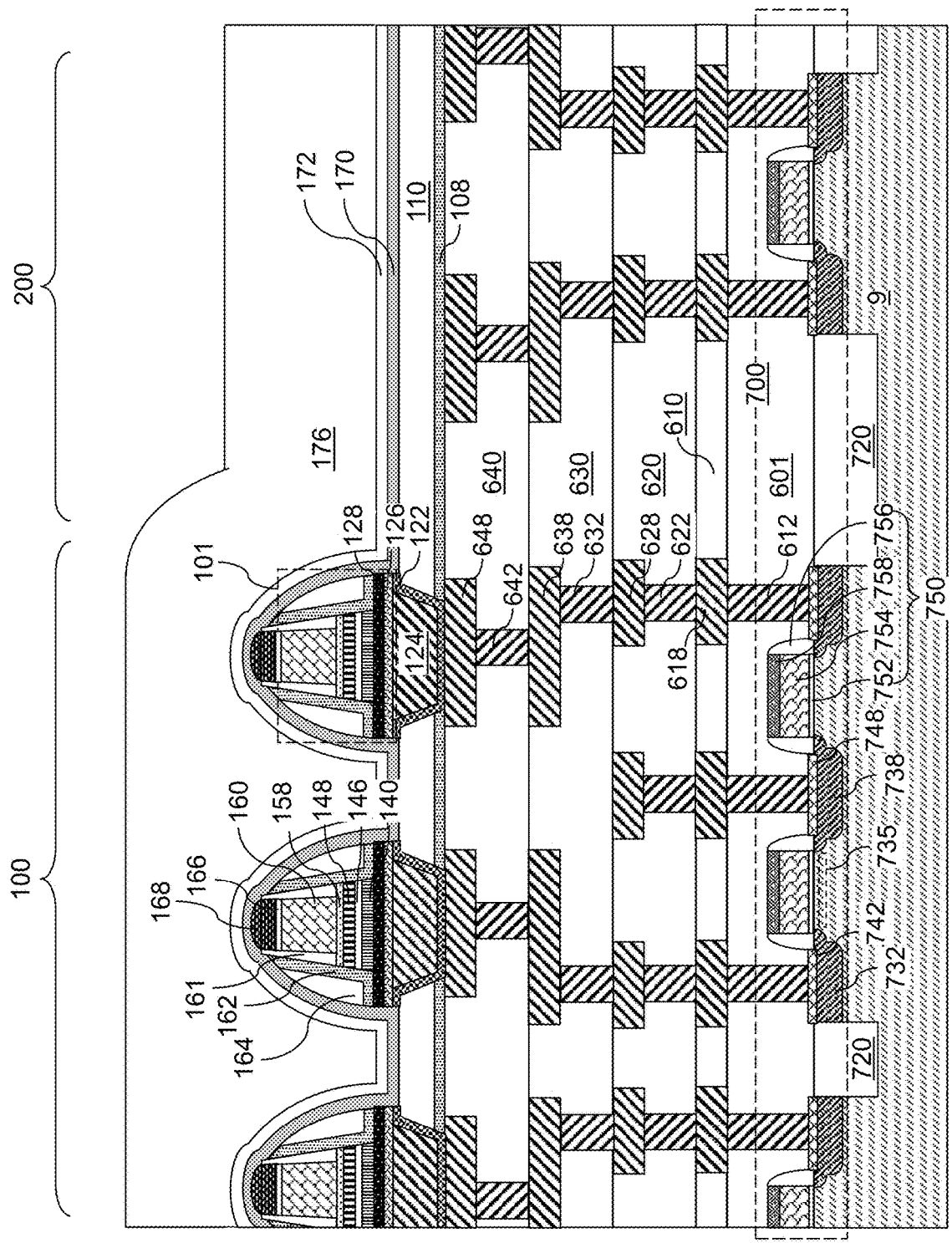
FIG. 12 is a vertical cross-sectional view of the exemplary structure after formation of an etch stop dielectric layer, a silicon oxide liner layer, and a first dielectric matrix layer according to an embodiment of the present disclosure.

Referring to FIG. 12, an etch stop dielectric layer 170 and an optional silicon oxide liner layer 172 may be sequentially formed by a respective deposition process. The etch stop dielectric layer 170 may include a dielectric material that may be used as a planarization stopping material during a chemical mechanical planarization process. The etch stop dielectric layer 170 may be subsequently used as an etch stop material during an anisotropic etch process. The etch stop dielectric layer 170 may include a non-reactive dielectric hard mask material. For example, the etch stop dielectric layer 170 may include, and/or may consist essentially of, aluminum oxide ($Al_2O_3$), aluminum nitride (AlN), hafnium oxide ($HfO_2$), zirconium oxide ($ZrO_2$), silicon nitride ($Si_3N_4$), silicon oxynitride (SiON), silicon carbide (SiC), silicon carbide nitride (SiCN), silicon oxycarbide (SiOC), or a nitrogen-free antireflection layer (NFARL) including a nitrogen-free inorganic polymer material. Other suitable materials within the contemplated scope of disclosure may also be used. The etch stop dielectric layer 170 may be deposited by plasma-enhanced chemical vapor deposition (PECVD), high density plasma chemical vapor deposition (HDP-CVD) or atmospheric pressure chemical vapor deposition (APCVD). The etch stop dielectric layer 170 may be deposited conformally or non-conformally.

The etch stop dielectric layer 170 may be formed over, and on, the array of outer dielectric spacers (162, 164), and over the array of memory cells 101. The etch stop dielectric layer 170 may comprise a horizontally-extending portion that continuously extends throughout the memory array region 100 and extends into the logic region 200, and an array of vertically-protruding portions that laterally surround each memory cell 101 in the array of memory cells 101. The thickness of a horizontally-extending portion of the etch stop dielectric layer 170 in the logic region 200 or above the top surfaces of the top electrodes 160 may be in a range from 5 nm to 50 nm, although lesser and greater thicknesses may also be used.

The optional silicon oxide liner layer 172, if present, may include SiC, $SiO_2$, SiN, or SiON. In one embodiment, the silicon oxide liner layer 172 comprises a non-porous silicon oxide material such as a TEOS oxide material formed by plasma-enhanced chemical vapor deposition (PECVD). The silicon oxide liner layer 172 may include undoped silicate glass or a doped silicate glass. The silicon oxide liner layer 172 may be formed by a conformal or non-conformal deposition process. The thickness of the horizontal portions of the silicon oxide liner layer 172 located in the logic region 200 or over the top surfaces of the top electrodes 160 may be in a range from 5 nm to 50 nm, although lesser and greater thicknesses may also be used.

A first dielectric matrix layer 176 may be formed over the silicon oxide liner layer 172 and the etch stop dielectric layer 170. The first dielectric matrix layer 176 may be formed by a chemical vapor deposition process. In one embodiment, the first dielectric matrix layer 176 includes a low-dielectric-constant (low-k) dielectric material having a dielectric constant less than the dielectric constant of thermal silicon oxide (i.e., 3.9). In one embodiment, the first dielectric matrix layer 176 includes an extremely-low-dielectric-constant (low-k) (ELK) dielectric material having a dielectric constant less than 2.5. In one embodiment, the first dielectric matrix layer 176 includes a porous silicon oxide-based dielectric material having a dielectric constant less than 2.5. In this case, the porous silicon oxide-based dielectric material may include a porogen-doped SiCO-based material having a porous structure. The porous structure may be formed by incorporating a pore generating material (a porogen) into a carbon-doped oxide using a chemical vapor deposition process. The chemical vapor deposition process may include a plasma-enhanced chemical vapor deposition process (PECVD) or a thermal chemical vapor deposition process. The index of refraction of the ELK dielectric material in the first dielectric matrix layer 176 may be in a range from 1.0 to 1.4 at the wavelength of 632.8 nm (which is the wavelength of commercially available HeNe laser measurement instruments).

A first portion of a top surface of the first dielectric matrix layer 176 located in the memory array region 100 may have a greater vertical separation distance from the semiconductor substrate 9 than a second portion of the top surface of the first dielectric matrix layer 176 formed in the logic region 200. In other words, the top surface of the first dielectric matrix layer 176 may be higher in the memory array region 100 than in the logic region 200. The first portion of the top surface of the first dielectric matrix layer 176 may include the topmost portion of the top surface of the first dielectric matrix layer 176. The height differential between the first portion of a top surface of the first dielectric matrix layer 176 located in the memory array region 100 and the second portion of the top surface of the first dielectric matrix layer 176 formed in the logic region 200 is due to the presence of the array of memory cells 101 and the array of outer dielectric spacers (162, 164) in the memory array region 100.

The contour of the top surface of the first dielectric matrix layer 176 initially follows the contour of the physically exposed surfaces of the array of memory cells 101 and the array of outer dielectric spacers (162, 164) in the memory array region 100 during deposition of the first dielectric matrix layer 176. Upon merging of material portions of the first dielectric matrix layer 176 midway between each neighboring pair of outer dielectric spacers (162, 164), the contour of the top surface of the first dielectric matrix layer 176 gradually flattens, and is raised with continual accumulation of the dielectric material until termination of the deposition process for the first dielectric matrix layer 176. In one embodiment, the duration of the deposition process that deposits the first dielectric matrix layer 176 may be selected such that the top surface of the portion of the first dielectric matrix layer 176 in the logic region 200 is within the same horizontal plane as the top surfaces of the top electrodes 160. In other words, the duration of the deposition process that deposits the first dielectric matrix layer 176 may be selected such that the thickness of the first dielectric matrix layer 176 in the logic region 200 is the same as the distance obtained by adding the height of a memory cell 101 and the thickness of a metallic barrier 122, and then subtracting the thickness of the silicon oxide liner layer 172 in the logic region 200, and then subtracting the thickness of the etch stop dielectric layer 170 in the logic region 200.

The height differential between the first portion of a top surface of the first dielectric matrix layer 176 located in the memory array region 100 and the second portion of the top surface of the first dielectric matrix layer 176 formed in the logic region 200 may be in a range from 40% to 100%, such as from 70% to 90%, of the vertical distance between the horizontal plane including the top surface of the via-level dielectric layer 110 and the horizontal plane including the top surfaces of the top electrodes 160. In one embodiment, the first dielectric matrix layer 176 may have a vertical undulation of the height in the memory array region 100. In one embodiment, the height differential between the first portion of a top surface of the first dielectric matrix layer 176 located in the memory array region 100 and the second portion of the top surface of the first dielectric matrix layer 176 formed in the logic region 200 may be in a range from 40 nm to 400 nm, such as from 80 nm to 200 nm, although lesser and greater height differentials may also be used.

Figure 13:
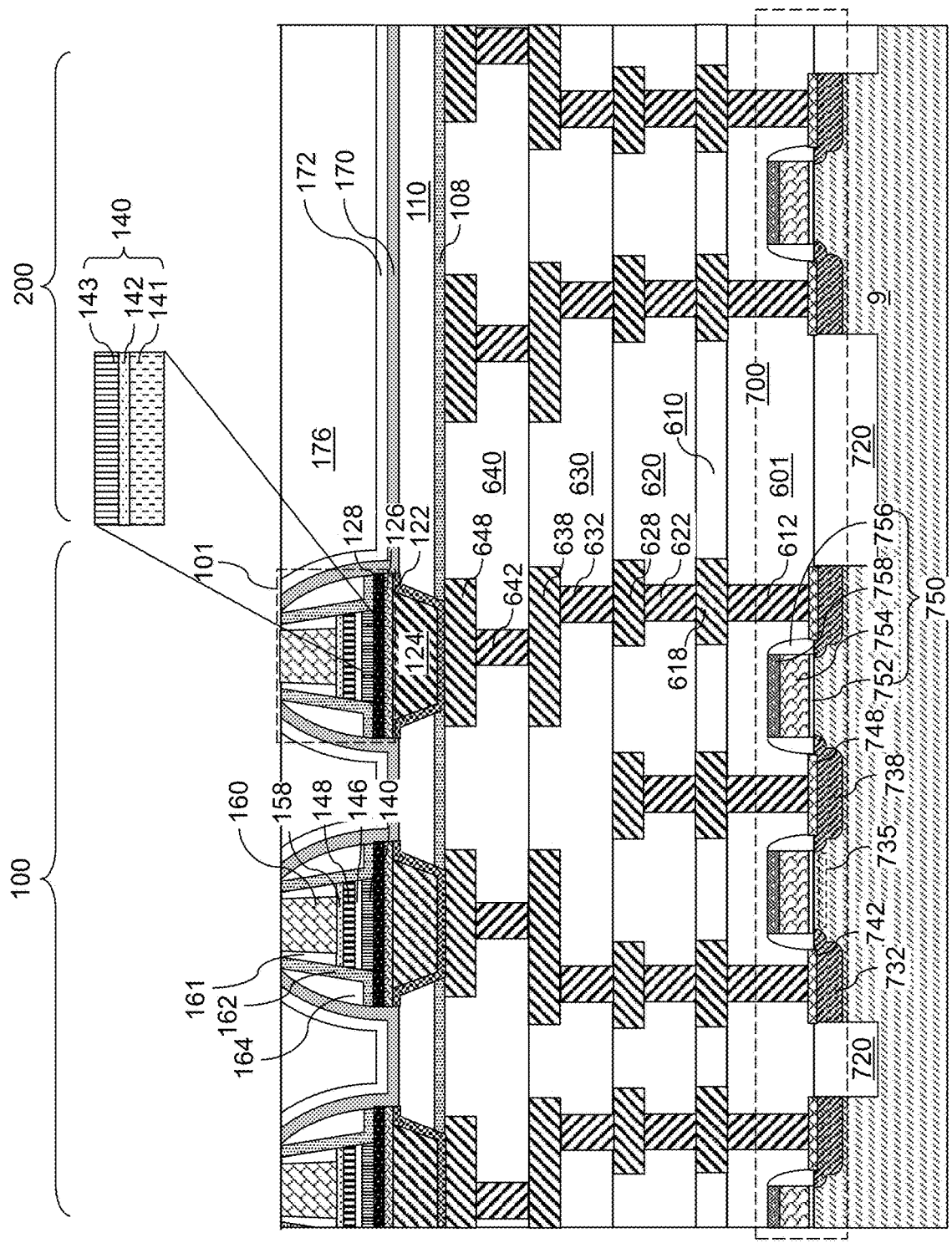
FIG. 13 is a vertical cross-sectional view of the exemplary structure after a chemical mechanical planarization process that planarizes the first dielectric matrix layer according to an embodiment of the present disclosure.

Referring to FIG. 13, material portions overlying the horizontal plane including the top surfaces of the top electrodes 160 may be removed by a planarization process. The planarization process may use a chemical mechanical planarization process. Specifically, the portions of the first dielectric matrix layer 176, the optional silicon oxide liner layer 172, the etch stop dielectric layer 170, the hard mask portions 168, and the dielectric pads 166 may be removed during the chemical mechanical planarization process. In one embodiment, the dielectric pads 166 may be used as stopping structures during the planarization process. Optionally, a wet etch process that etches the material of the hard mask portions 168 selective to the material of the dielectric pads 166 may be used during the planarization process. Generally, the entirety of the hard mask portions 168 may be removed above the top electrodes 160. Top surfaces of the top electrodes 160 may be physically exposed after the planarization process. The planarized top surface of the first dielectric matrix layer 176 may be coplanar with the top surfaces of the top electrodes 160.

In one embodiment, each of the inner dielectric spacers 161 may have a physically exposed annular horizontal top surface. Each of the outer dielectric spacers (162, 164) may have a physically exposed annular horizontal top surface. In one embodiment, annular top surfaces of the silicon oxide liner layer 172 and annular top surfaces of the etch stop dielectric layer 170 may be physically exposed within the horizontal plane including the top surface of the first dielectric matrix layer 176.

An array of magnetic tunnel junction (MTJ) memory cells 101 may be formed in the first dielectric matrix layer 176, which overlies the dielectric material layers (601, 610, 620, 630, 640). Each MTJ memory cell 101 within the array comprises: a vertical stack (141, 142, 143, 146, 148, 158) including a reference magnetization structure 143, a nonmagnetic tunnel barrier 146, and a free magnetization structure 148 and located over the semiconductor substrate 9; a top electrode 160 overlying a center portion of the free magnetization structure 148; an inner dielectric spacer 161 overlying a peripheral portion of the free magnetization structure 148 and laterally surrounding the top electrode 160 and including a tapered outer sidewall; and an outer dielectric spacer (162, 164) laterally surrounding the inner dielectric spacer 161 and the vertical stack (141, 142, 143, 146, 148, 158) and laterally surrounded by a dielectric matrix layer such as the first dielectric matrix layer 176.

In one embodiment, each MTJ memory cell 101 comprises a bottom electrode 126 contacting a bottom surface of the vertical stack (141, 142, 143, 146, 148, 158) and an annular bottom surface of the outer dielectric spacer (162, 164). In one embodiment, the inner dielectric spacer 161 of each MTJ memory cell 101 includes a tapered outer sidewall having a taper angle in a range from 2 degrees to 10 degrees with respective to a vertical direction. In one embodiment, the bottom periphery of the tapered outer sidewall of the inner dielectric spacer 161 may be vertically coincident with an outer sidewall of the vertical stack (141, 142, 143, 146, 148, 158) within each MTJ memory cell 101.

Figure 14:
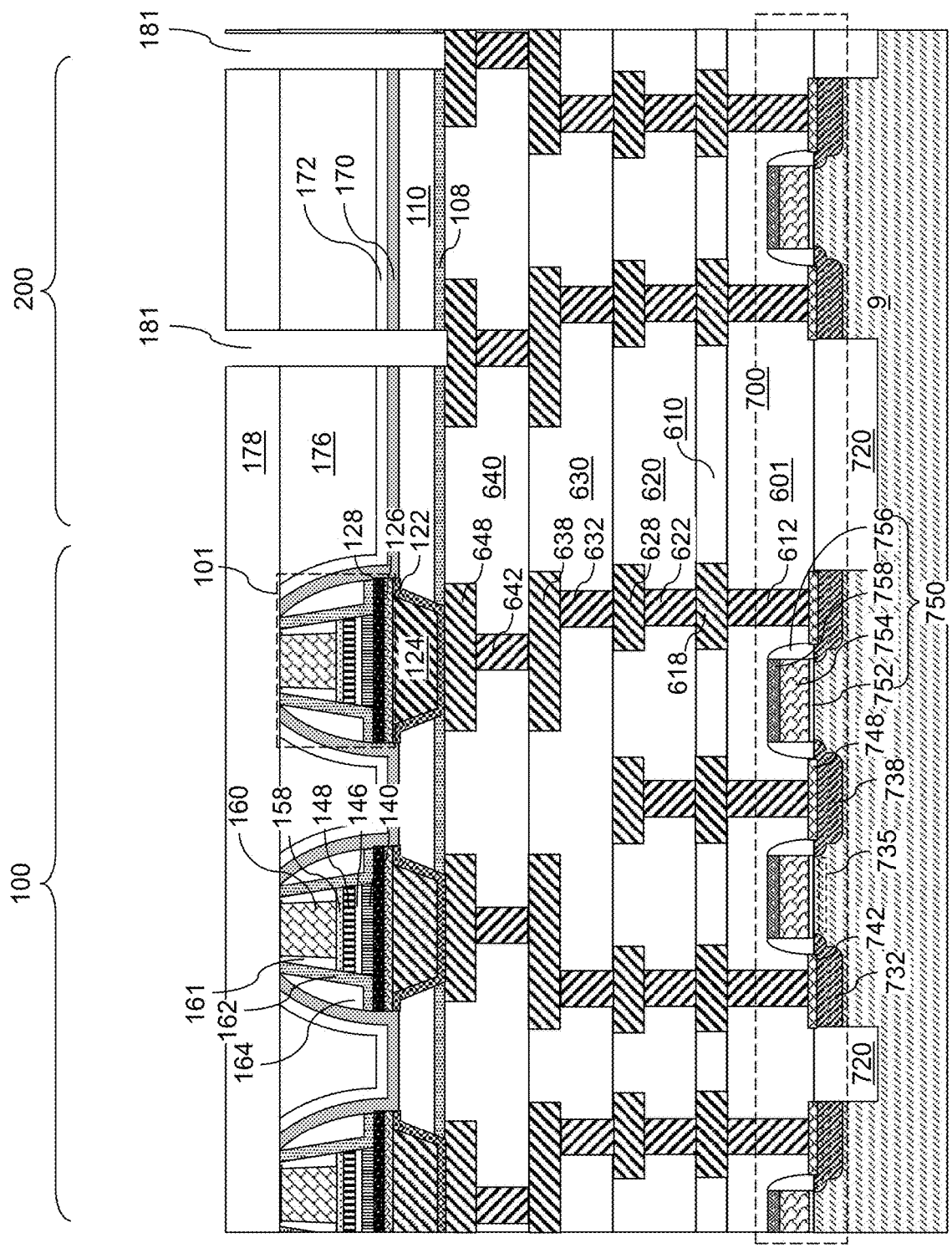
FIG. 14 is a vertical cross-sectional view of the exemplary structure after formation of a second dielectric matrix layer and via cavities in the logic region according to an embodiment of the present disclosure.

Referring to FIG. 14, a second dielectric matrix layer 178 may be deposited over, and directly on, the physically exposed horizontal surface of the remaining portion of the first dielectric matrix layer 176. The second dielectric matrix layer 178 may have the same material composition as, or may have a material composition that is different from, the material composition of the first dielectric matrix layer 176. In one embodiment, the second dielectric matrix layer 178 may include a low-dielectric-constant (low-k) dielectric material, such as an ELK dielectric material having a dielectric constant less than 2.5. In one embodiment, the second dielectric matrix layer 178 includes a porous silicon oxide-based dielectric material having a dielectric constant less than 2.5. The thickness of the second dielectric matrix layer 178 may be the same as the target height of metallic cell contact structures to be formed on the top surfaces of the top electrodes 160. For example, the second dielectric matrix layer 178 may have a thickness in a range from 20 nm to 160 nm, such as from 40 nm to 80 nm, although lesser and greater thicknesses may also be used. In one embodiment, the entire top surface of the second dielectric matrix layer 178 may be located within a first horizontal plane, and the entire bottom surface of the second dielectric matrix layer 178 may be located within a second horizontal plane. Thus, the entirety of the second dielectric matrix layer 178 may have a uniform thickness throughout.

A first photoresist layer (not shown) may be applied over the second dielectric matrix layer 178, and may be lithographically patterned to form an array of openings in the logic region 200. The pattern of the openings in the photoresist layer may be transferred through the second dielectric matrix layer 178, the first dielectric matrix layer 176, the silicon oxide liner layer 172, and the etch stop dielectric layer 170. In one embodiment, the etch stop dielectric layer 170 may be used as an etch stop layer for a first etch step that etches the materials of the second dielectric matrix layer 178, the first dielectric matrix layer 176, and the silicon oxide liner layer 172, and an etch chemistry that etches the material of the etch stop dielectric layer 170 may be used during a second etch step of the anisotropic etch process. Via cavities 181 are formed underneath each opening in the photoresist layer. A top surface of the via-level dielectric layer 110 may be physically exposed at the bottom of each via cavity 181. The first photoresist layer may be subsequently removed, for example, by ashing.

Figure 15:
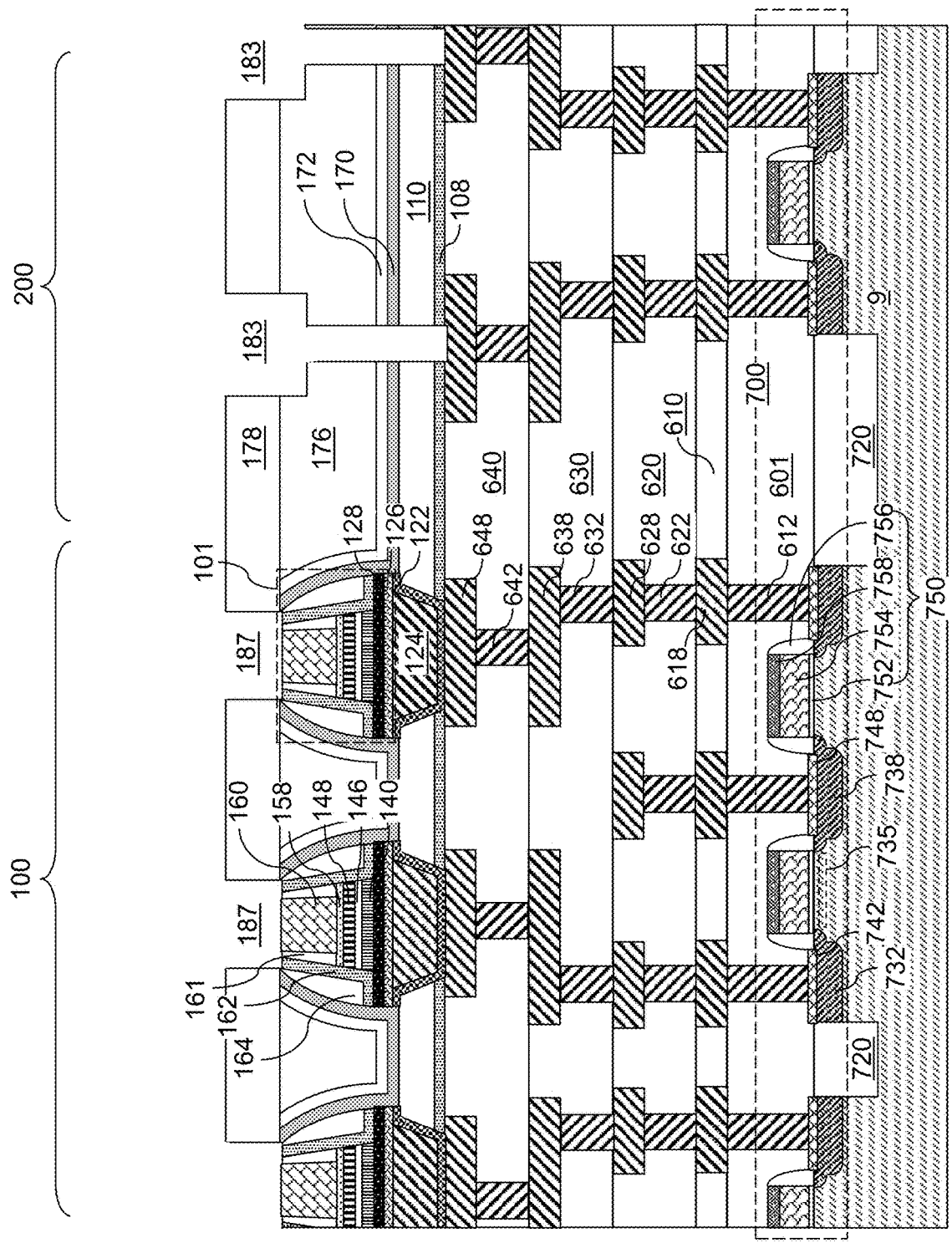
FIG. 15 is a vertical cross-sectional view of the exemplary structure after formation of integrated line and via cavities in the logic region and cell contact cavities in the memory array region according to an embodiment of the present disclosure.

Referring to FIG. 15, a second photoresist layer may be applied over the second dielectric matrix layer 178, and may be lithographically patterned to form line patterns. The areas of the line pattern in the photoresist layer may include all areas of the via cavities 181. Thus, the second photoresist layer may be removed from inside the via cavities 181 upon development of the second photoresist layer. An anisotropic etch process may be performed to transfer the line patterns in the second photoresist layer into underlying material portions. Each via cavity 181 may be vertically extended through the via-level dielectric layer 110 and through the dielectric cap layer 108 so that a top surface of a respective fourth metal line structures 648 may be physically exposed underneath each via cavity 181. Further, portions of the second dielectric matrix layer 178 that are not masked by the patterned second photoresist layer may be etched through to form line cavities. Integrated line and via cavities 183 may be formed in the logic region 200. Each integrated line and via cavity 183 may include a respective line cavity and at least one via cavity adjoined to a bottom surface of the respective line cavity. Cell contact cavities 187 overlying a respective one of the top electrodes 160 may be formed in the memory array region 100.

The anisotropic etch process that forms the cell contact cavities 187 and the integrated line and via cavities 183 may be selective to the material of the etch stop dielectric layer 170. The cell contact cavities 187 may be formed through the second dielectric matrix layer 178 by performing the anisotropic etch process, which etches the material of the second dielectric matrix layer 178 selective to the material of the etch stop dielectric layer 170. In one embodiment, the lateral extent of a cell contact cavity 187 (which is herein referred to as a first cell contact cavity) selected from the array of cell contact cavities 187 may be greater than the lateral extent of a respective underlying top electrode 160, i.e., greater than the lateral extent of the top electrode that underlies the first cell contact cavity. In one embodiment a plurality of cell contact cavities 187 may have a respective lateral extent that is greater than the lateral extent of a respective underlying top electrode 160. In one embodiment, each of the cell contact cavities 187 may have a respective lateral extent that is greater than the lateral extent of a respective underlying top electrode 160.

In one embodiment, the bottom surfaces of the line trenches within the integrated line and via cavities 183 may be formed below the horizontal interface between the first dielectric matrix layer 176 and the second dielectric matrix layer 178. Vertically-protruding portions of the etch stop dielectric layer 170 that laterally surround the memory cells 101 function as etch stop material portions while the bottom surfaces of the line trenches are vertically recessed below the horizontal interface between the first dielectric matrix layer 176 and the second dielectric matrix layer 178.

Figure 16:
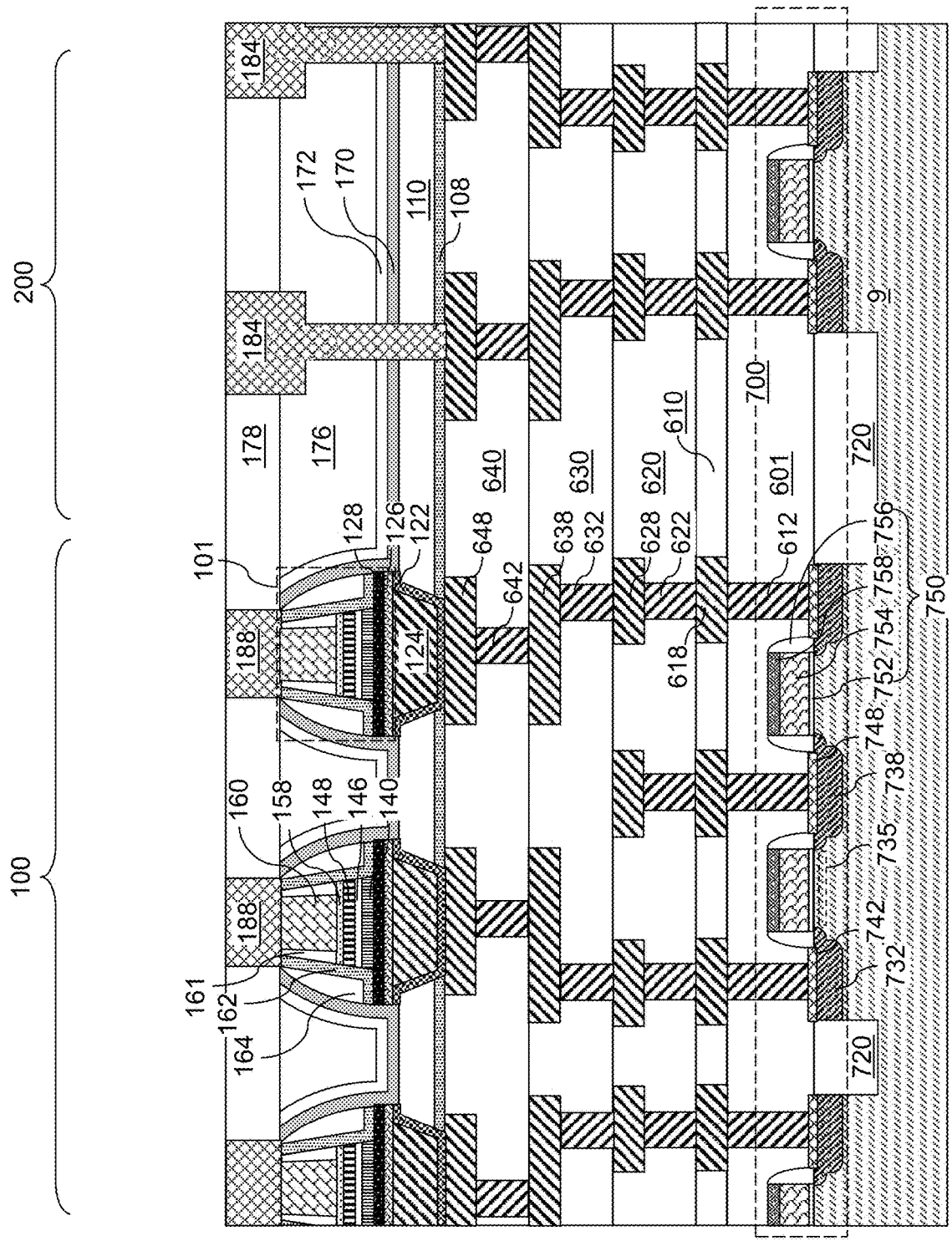
FIG. 16 is a vertical cross-sectional view of the exemplary structure after formation of integrated line and via structures in the logic region and metallic cell contact structures in the memory array region according to an embodiment of the present disclosure.

Referring to FIG. 16, at least one conductive material may be deposited in the line and via cavities 183 and in the cell contact cavities 187. The at least one conductive material may include, for example, a metallic liner material such as TiN, TaN, or WN, and a metallic fill material such as W, Cu, Co, Ru, Mo, Al, alloys thereof, and/or a layer stack thereof. Other suitable materials within the contemplated scope of disclosure may also be used. Excess portions of the at least one conductive material overlying the horizontal plane including the top surface of the second dielectric matrix layer 178 may be removed by a planarization process such as a chemical mechanical polish process. Each remaining portion of the at least one conductive material that fills an integrated line and via cavity 183 constitutes an integrated line and via structure 184. Each remaining portion of the at least one conductive material that fills a cell contact cavity 187 constitutes metallic cell contact structure 188. The integrated line and via structure 184, the metallic cell contact structure 188, and the bottom electrode connection via structure (122, 124) collectively constitute memory-cell-level metal interconnect structures (122, 124, 184, 188), i.e., metal interconnect structures that are located in the memory cell level that occupies the volume between the horizontal plane including the top surfaces of the fourth metal line structures 648 and the horizontal plane including the top surfaces of the integrated line and via structure 184 and the metallic cell contact structure 188.

Figure 17:
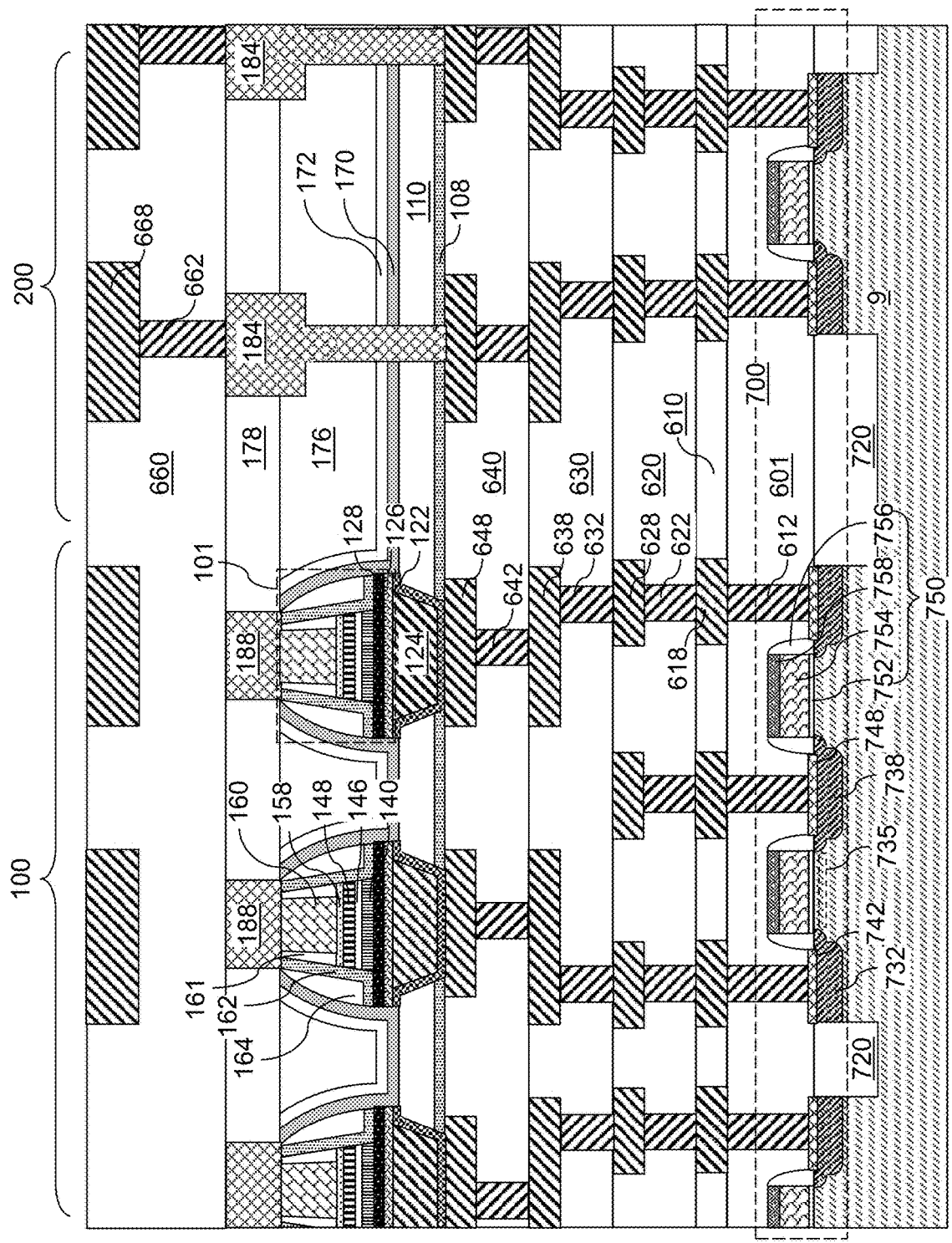
FIG. 17 is a vertical cross-sectional view of the exemplary structure after formation of additional metal interconnect structures formed in additional dielectric material layers according to an embodiment of the present disclosure.

Referring to FIG. 17, additional dielectric material layers and additional metal interconnect structures may be subsequently formed as needed. The combination of the dielectric cap layer 108, the via-level dielectric layer 110, the etch stop dielectric layer 170, the silicon oxide liner layer 172, the first dielectric matrix layer 176, and the second dielectric matrix layer 178 collectively function as a fifth line-and-via-level dielectric material layer. A sixth line-and-via-level dielectric material layer 660 may be formed over the second dielectric matrix layer 178. Fifth metal via structures 662 may be formed in a lower portion of the sixth line-and-via-level dielectric material layer 660, and sixth metal line structures 668 formed in an upper portion of the sixth line-and-via-level dielectric material layer 640. Bonding pads (not shown) may be formed over the additional metal interconnect structures.

Figure 18:
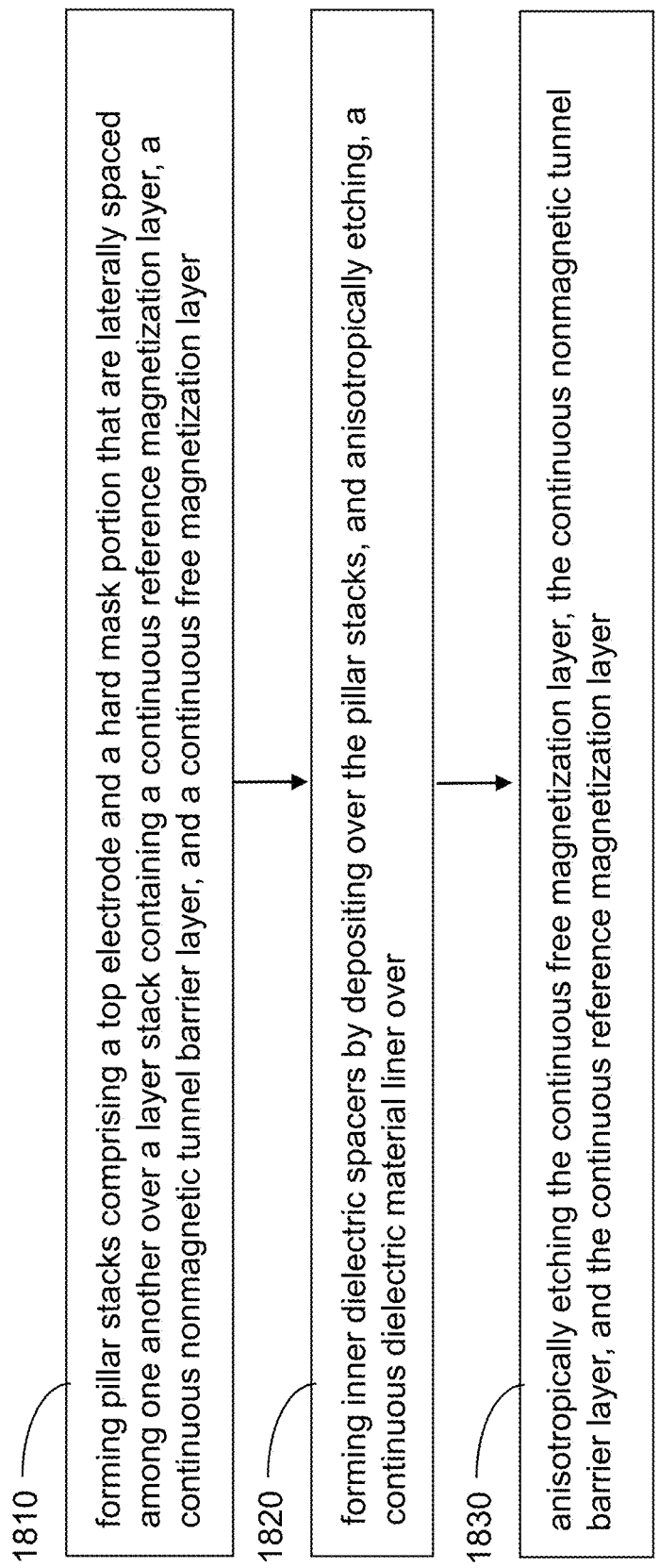
FIG. 18 is a flowchart that illustrates the general processing steps of the methods of the present disclosure.

Referring to FIG. 18, a general method of forming a memory device is provided according to an embodiment of the present disclosure. Referring to step 1810, pillar stacks (160, 166, 168) comprising a top electrode 160 and a hard mask portion 168 that are laterally spaced from one another may be formed over a layer stack containing a continuous reference magnetization layer 143L, a continuous nonmagnetic tunnel barrier layer 146L, and a continuous free magnetization layer 148L. Referring to step 1820, inner dielectric spacers 161 may be formed by depositing a continuous dielectric liner 161L over the pillar stacks (160, 166, 168), and by anisotropically etching the continuous dielectric liner 161L. Referring to step 1830, the continuous free magnetization layer 148L, the continuous nonmagnetic tunnel barrier layer 146L, and the continuous reference magnetization layer 143L may be anisotropically etched using the inner dielectric spacers 161 and the hard mask portions as an etch mask. Vertical stacks (141, 142, 143, 146, 148, 158) containing a respective reference magnetization structure 143, a respective nonmagnetic tunnel barrier 146, and a respective free magnetization structure 148 may be formed. Each of the vertical stacks (141, 142, 143, 146, 148, 158) has a top periphery that coincides with an outer bottom periphery of a respective one of the inner dielectric spacers 161.

Referring to all drawings and according to various embodiments of the present disclosure, a magnetic tunnel junction memory device is provided, which comprises: a vertical stack (141, 142, 143, 146, 148, 158) comprising a reference magnetization structure 143, a nonmagnetic tunnel barrier 146, and a free magnetization structure 148 and located over a semiconductor substrate 9; a top electrode 160 overlying a center portion of the free magnetization structure 148; and an inner dielectric spacer 161 overlying a peripheral portion of the free magnetization structure 148 and laterally surrounding the top electrode 160 and including a tapered outer sidewall having a taper angle in a range from 2 degrees to 10 degrees with respective to a vertical direction.

According to another embodiment of the present disclosure, a memory device is provided, which comprises: field effect transistors located on a semiconductor substrate 9; metal interconnect structures (612, 618, 622, 628, 632, 638, 642, 648) formed in dielectric material layers (601, 610, 620, 630, 640) overlying the field effect transistors; and an array of magnetic tunnel junction (MTJ) memory cells 101 formed in a dielectric matrix layer (such as a first dielectric matrix layer 176) that overlies the dielectric material layers (601, 610, 620, 630, 640), wherein each MTJ memory cell 101 within the array comprises: a vertical stack (141, 142, 143, 146, 148, 158) comprising a reference magnetization structure 143, a nonmagnetic tunnel barrier 146, and a free magnetization structure 148 and located over a semiconductor substrate 9; a top electrode 160 overlying a center portion of the free magnetization structure 148; an inner dielectric spacer 161 overlying a peripheral portion of the free magnetization structure 148 and laterally surrounding the top electrode 160 and including a tapered outer sidewall; and an outer dielectric spacer (162, 164) laterally surrounding the inner dielectric spacer 161 and the vertical stack (141, 142, 143, 146, 148, 158) and laterally surrounded by the dielectric matrix layer (such as a first dielectric matrix layer 176).

The various embodiments of the present disclosure may be used to provide magnetic tunnel junctions (140, 146, 148) that may be resistant to electrical shorts to top electrodes 160. The inner dielectric spacers 161 prevent deposition of metallic material that may cause electrical shorts between the magnetic tunnel junctions (140, 146, 148) and the top electrodes 160 by covering sidewalls of the top electrodes 160 throughout the anisotropic etch process that patterns the magnetic tunnel junctions (140, 146, 148). The magnetic tunnel junctions (140, 146, 148) may have higher manufacturing yield and enhanced reliability during usage by protecting the top electrodes 160 from electrical shorts with the inner dielectric spacers 161 during the manufacturing process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetic tunnel junction memory device, comprising:
   a vertical stack comprising a reference magnetization structure, a nonmagnetic tunnel barrier, and a free magnetization structure and located over a semiconductor substrate;
   a top electrode overlying a center portion of the free magnetization structure;
   an inner dielectric spacer overlying a peripheral portion of the free magnetization structure and laterally surrounding the top electrode and including a tapered outer sidewall having a taper angle in a range from 2 degrees to 10 degrees with respective to a vertical direction;
   an outer dielectric spacer laterally surrounding the inner dielectric spacer and the vertical stack; and
   a metallic cell contact structure contacting a top surface of the top electrode within a horizontal plane including a top surface of a dielectric matrix layer, wherein the metallic cell contact structure contacts a top surface of the inner dielectric spacer and a top surface of the outer dielectric spacer.

2. The magnetic tunnel junction memory device of claim 1, wherein a bottom periphery of the tapered outer sidewall of the inner dielectric spacer is vertically coincident with an outer sidewall of the vertical stack.

3. The magnetic tunnel junction memory device of claim 1, further comprising a bottom electrode underlying the vertical stack and the outer dielectric spacer.

4. The magnetic tunnel junction memory device of claim 3, further comprising a nonmagnetic metallic buffer layer located between the bottom electrode and the vertical stack, wherein a bottom periphery of the outer dielectric spacer coincides with a periphery of a top surface of the nonmagnetic metallic buffer layer.

5. The magnetic tunnel junction memory device of claim 3, further comprising a metallic via fill material portion that contacts a bottom surface of the bottom electrode and has a lesser lateral extent than the bottom electrode.

6. The magnetic tunnel junction memory device of claim 1, wherein the inner dielectric spacer has a variable width that strictly decreases with a vertical distance from a horizontal plane including a bottom surface of the top electrode.

7. The magnetic tunnel junction memory device of claim 1, wherein the vertical stack comprises a capping layer comprising a nonmagnetic conductive material and contacting a bottom surface of the top electrode.

8. The magnetic tunnel junction memory device of claim 1, wherein the reference magnetization structure, the nonmagnetic tunnel barrier, and the free magnetization structure include sidewalls located entirely within a common tapered plane having a straight profile in vertical cross-sectional views and having closed two-dimensional shapes in horizontal cross-sectional views.

9. The magnetic tunnel junction memory device of claim 1, further comprising:
   a field effect transistor located on the semiconductor substrate; and
   metal interconnect structures formed in dielectric material layers overlying the field effect transistor and underlying the vertical stack,
   wherein the reference magnetization structure is connected to a node of the field effect transistor through a subset of the metal interconnect structures.

10. The magnetic tunnel junction memory device of claim 1, further comprising:
   at least one dielectric matrix layer laterally surrounding the vertical stack, the top electrode, and the inner dielectric spacer; and
   a metallic cell contact structure formed in an upper portion of the at least one dielectric matrix layer and contacting a top surface of the top electrode.

11. The magnetic tunnel junction memory device of claim 1, wherein the outer dielectric spacer comprises:
   a first dielectric spacer comprising an annular horizontally-extending portion and a vertically-extending portion that is adjoined to an inner periphery of the annular horizontally-extending portion and contacting sidewalls of the vertical stack and sidewalls of the inner dielectric spacer; and
   a second dielectric spacer overlying an annular top surface of the annular horizontally-extending portion of the first dielectric spacer and laterally surrounding the second dielectric spacer.

12. A memory device comprising:
   field effect transistors located on a semiconductor substrate;
   metal interconnect structures formed in dielectric material layers overlying the field effect transistors; and
   an array of magnetic tunnel junction (MTJ) memory cells formed in a dielectric matrix layer that overlies the dielectric material layers, wherein each MTJ memory cell within the array comprises:
      a vertical stack comprising a reference magnetization structure, a nonmagnetic tunnel barrier, and a free magnetization structure and located over a semiconductor substrate;
      a top electrode overlying a center portion of the free magnetization structure;
      an inner dielectric spacer overlying a peripheral portion of the free magnetization structure and laterally surrounding the top electrode and including a tapered outer sidewall; and
      an outer dielectric spacer laterally surrounding the inner dielectric spacer and the vertical stack and laterally surrounded by the dielectric matrix layer, wherein the outer dielectric spacer comprises:
         a first dielectric spacer comprising an annular horizontally-extending portion and a vertically-extending portion that is adjoined to an inner periphery of the annular horizontally-extending portion and contacting sidewalls of the vertical stack and sidewalls of the inner dielectric spacer; and
         a second dielectric spacer overlying an annular top surface of the annular horizontally-extending portion of the first dielectric spacer and laterally surrounding the first dielectric spacer.

13. The memory device of claim 12, wherein each MTJ memory cell comprises a bottom electrode contacting a bottom surface of the vertical stack and an annular bottom surface of the outer dielectric spacer.

14. The memory device of claim 13, wherein:
   the inner dielectric spacer of each MTJ memory cell includes a tapered outer sidewall having a taper angle in a range from 2 degrees to 10 degrees with respective to a vertical direction; and
   a bottom periphery of the tapered outer sidewall of the inner dielectric spacer is vertically coincident with an outer sidewall of the vertical stack within each MTJ memory cell.

15. The memory device of claim 12, further comprising a metallic cell contact structure contacting a top surface of the top electrode within a horizontal plane including a top surface of the dielectric matrix layer, wherein the metallic cell contact structure contacts a top surface of the inner dielectric spacer and a top surface of the outer dielectric spacer.

16. A memory device comprising a magnetic tunnel junction (MTJ) memory cell located within a dielectric matrix layer, the MTJ memory cell comprising:
   a vertical stack comprising a reference magnetization layer, a nonmagnetic tunnel barrier, and a free magnetization layer;
   a top electrode overlying a center portion of the free magnetization layer;
   an inner dielectric spacer overlying a peripheral portion of the free magnetization structure and laterally surrounding the top electrode and including a tapered outer sidewall that has a bottom periphery that coincides with a periphery of a top surface of the free magnetization layer;
   an outer dielectric spacer laterally surrounding the inner dielectric spacer and the vertical stack and laterally surrounded by the dielectric matrix layer; and
   a metallic cell contact structure contacting a top surface of the top electrode, a top surface of the inner dielectric spacer and a top surface of the outer dielectric spacer.

17. The memory device of claim 16, wherein the outer dielectric spacer comprises:
   a first dielectric spacer comprising an annular horizontally-extending portion and a vertically-extending portion that is adjoined to an inner periphery of the annular horizontally-extending portion and contacting sidewalls of the vertical stack and sidewalls of the inner dielectric spacer; and
   a second dielectric spacer overlying an annular top surface of the annular horizontally-extending portion of the first dielectric spacer and laterally surrounding the first dielectric spacer.

18. The memory device of claim 16, wherein:
   the MTJ memory cell comprises a nonmagnetic metallic buffer contacting a bottom surface of the vertical stack; and
   a periphery of a top surface of the nonmagnetic metallic buffer coincides with an outer periphery of a bottom surface of the outer dielectric spacer.

19. The memory device of claim 16, wherein the top surface of the top electrode, the surface of the inner dielectric spacer, the top surface of the outer dielectric spacer are located within a horizontal plane including a top surface of the dielectric matrix layer.

20. The memory device of claim 16, further comprising an etch stop dielectric layer that comprises:
   a horizontally-extending portion that underlies the dielectric matrix layer; and
   a vertically-extending portion that laterally surrounds the MTJ memory cells and contacts an entirety of outer sidewalls of the outer dielectric spacer and having an opening above the inner dielectric spacer and the top electrode, wherein a topmost surface of the vertically-extending portion is located within a same horizontal plane as a top surface of the dielectric matrix layer.

* * * * *